US009178128B2

(12) United States Patent
Jovovic et al.

(10) Patent No.: US 9,178,128 B2
(45) Date of Patent: Nov. 3, 2015

(54) THERMOELECTRIC DEVICES WITH INTERFACE MATERIALS AND METHODS OF MANUFACTURING THE SAME

(71) Applicant: GENTHERM INCORPORATED, Northville, MI (US)

(72) Inventors: Vladimir Jovovic, Pasadena, CA (US); Dmitri Kossakovski, South Pasadena, CA (US); Ellen M. Heian, Azusa, CA (US)

(73) Assignee: Gentherm Incorporated, Northville, MI (US)

( * ) Notice: Subject to any disclaimer, the term of this patent is extended or adjusted under 35 U.S.C. 154(b) by 21 days.

(21) Appl. No.: 13/679,473

(22) Filed: Nov. 16, 2012

(65) Prior Publication Data

US 2013/0146116 A1    Jun. 13, 2013

Related U.S. Application Data

(60) Provisional application No. 61/561,177, filed on Nov. 17, 2011, provisional application No. 61/561,200, filed on Nov. 17, 2011, provisional application No. 61/650,385, filed on May 22, 2012.

(51) Int. Cl.
*H01L 35/28* (2006.01)
*H01L 35/08* (2006.01)
(Continued)

(52) U.S. Cl.
CPC *H01L 35/28* (2013.01); *H01B 1/16* (2013.01); *H01B 1/18* (2013.01); *H01L 35/08* (2013.01); *H01L 35/34* (2013.01)

(58) Field of Classification Search
CPC ..... B22F 2999/00; H01L 35/32; H01L 35/08; H01L 35/30; H01L 35/00

USPC .......................................................... 136/208
See application file for complete search history.

(56) References Cited

U.S. PATENT DOCUMENTS 3,442,718 A * 5/1969 Dingwall et al. ............. 136/205
3,505,728 A   4/1970 Hare et al.
(Continued)

FOREIGN PATENT DOCUMENTS

EP    1 324 400 A    7/2003
EP    1 744 326       1/2007
(Continued)

OTHER PUBLICATIONS

O.E.D. definition of "surround".*
(Continued)

*Primary Examiner* — Jennifer Michener
*Assistant Examiner* — Sadie White
(74) *Attorney, Agent, or Firm* — Knobbe, Martens, Olson & Bear LLP

(57) ABSTRACT

Thermoelectric devices with interface materials and methods of manufacturing the same are provided. A thermoelectric device can include at least one shunt, at least one thermoelectric element in thermal and electrical communication with the at least one shunt, and at least one interface material between the at least one shunt and the at least one thermoelectric element. The at least one interface material can comprise a plurality of regions comprising a core material with each region separated from one another and surrounded by a shell material. The interface material can be configured to undergo deformation under (i) a normal load between the at least one shunt and the at least one thermoelectric element or (ii) a shear load between the at least one shunt and the at least one thermoelectric element. The deformation can reduce interface stress between the at least one shunt and the at least one thermoelectric element.

35 Claims, 21 Drawing Sheets

(51) Int. Cl.
  *H01L 35/34* (2006.01)
  *H01B 1/16* (2006.01)
  *H01B 1/18* (2006.01)

(56) References Cited

U.S. PATENT DOCUMENTS

| | | | |
|---|---|---|---|
| 3,657,014 A * | 4/1972 | Faber | 429/234 |
| 3,779,814 A | 12/1973 | Miles et al. | |
| 3,859,143 A | 1/1975 | Krebs | |
| 3,880,674 A * | 4/1975 | Saunders | 136/237 |
| 4,125,122 A * | 11/1978 | Stachurski | 136/205 |
| 4,211,889 A * | 7/1980 | Kortier et al. | 136/237 |
| 4,731,338 A | 3/1988 | Ralston et al. | |
| 5,900,071 A | 5/1999 | Harman | |
| 6,274,802 B1 | 8/2001 | Fukuda et al. | |
| 6,319,744 B1 | 11/2001 | Hoon et al. | |
| 6,407,435 B1 | 6/2002 | Ma et al. | |
| 6,894,369 B2 | 5/2005 | Irino et al. | |
| 6,942,728 B2 | 9/2005 | Caillat et al. | |
| 7,480,984 B1 | 1/2009 | Sakamoto et al. | |
| 2002/0024154 A1 | 2/2002 | Hara et al. | |
| 2004/0042181 A1* | 3/2004 | Nagasaki | 361/725 |
| 2006/0005873 A1 | 1/2006 | Kambe | |
| 2006/0118159 A1* | 6/2006 | Tsuneoka et al. | 136/211 |
| 2006/0118160 A1 | 6/2006 | Funahashi et al. | |
| 2006/0157101 A1* | 7/2006 | Sakamoto et al. | 136/201 |
| 2008/0283110 A1* | 11/2008 | Jin et al. | 136/206 |
| 2010/0031987 A1* | 2/2010 | Bell et al. | 136/200 |
| 2010/0167444 A1* | 7/2010 | Chen et al. | 438/54 |
| 2011/0099991 A1 | 5/2011 | Stefan et al. | |
| 2012/0103381 A1* | 5/2012 | Leavitt et al. | 136/238 |
| 2012/0160293 A1* | 6/2012 | Jinushi et al. | 136/237 |
| 2012/0167937 A1* | 7/2012 | Fann et al. | 136/224 |
| 2012/0174568 A1 | 7/2012 | Bruck et al. | |
| 2012/0177864 A1 | 7/2012 | Limbeck et al. | |
| 2012/0305043 A1 | 12/2012 | Kossakovski et al. | |
| 2013/0037073 A1 | 2/2013 | LaGrandeur et al. | |
| 2013/0104953 A1 | 5/2013 | Poliquin et al. | |

FOREIGN PATENT DOCUMENTS

| | | |
|---|---|---|
| EP | 2 159 854 | 3/2010 |
| JP | 07-111344 | 4/1995 |
| JP | 09-275692 | 10/1997 |
| JP | 10 74986 | 3/1998 |
| JP | 10-74986 | 3/1998 |
| JP | 2003 332644 | 11/2003 |
| JP | 2003 338641 | 11/2003 |
| JP | 2010 034508 | 2/2010 |
| WO | WO 99/13511 | 3/1999 |
| WO | WO 01/63674 | 8/2001 |

OTHER PUBLICATIONS

O.E.D. definition of "around".*
Kambe et al., "Encapsulated Thermoelectric Modules and Compliant Pads for Advanced Thermoelectric Systems," *J. Electronic Materials*, vol. 39, No. 9, 1418-21 (2010).
International Search Report and Written Opinion for PCT/US2012/065588, mailed Apr. 5, 2013.
Hsu, Kuei Fang et al., Cubic $AgPb_mSbTe_{2+m}$: Bulk Thermoelectric Materials with High Figure of Merit, Science, Feb. 6, 2004, p. 818-821, vol. 303.
Miner, A., et al. "Thermo-Electro-Mechanical Refrigeration Based on Transient Thermoelectric Effects", Applied Physics letters, vol. 75, pp. 1176-1178 (1999).
Snyder, G. Jeffrey, et al., "Complex thermoelectric materials," Nature Materials, vol. 7, Feb. 2008, pp. 105-114.
Snyder, G. Jeffrey: "Application of the compatibility factor to the design of segmented and cascaded thermoelectric generators" Applied Physics Letters, AIP, American Institute of Physics, Melville, NY, vol. 84, No. 13, Mar. 29, 2004, pp. 2436-2438, XPO12060957 ISSN: 0003-6951.
Tech Briefs, "Nickel-Graphite Composite Compliant Interface and/or Hot Shoe Material," article dated Sep. 1, 2013. From http://www.techbriefs.com/legal-footer-127/50-ntb/tech-briefs/materials52/17192-npo-48621 on Feb. 27, 2015.
V.A. Sethuraman, N. Van Winkle, D.P. Abraham, A.F. Bower, P.R. Guduru, "Real-time stress measurements in lithium-ion battery negative-electrodes," *Journal of Power Sources*, vol. 206, May 15, 2012, pp. 334-342.

* cited by examiner

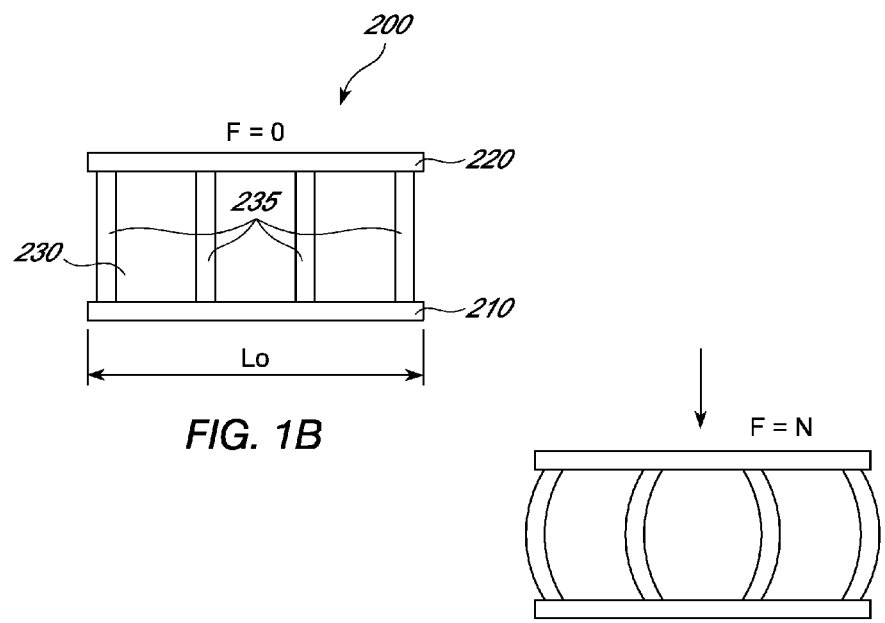
FIG. 1B
FIG. 1C
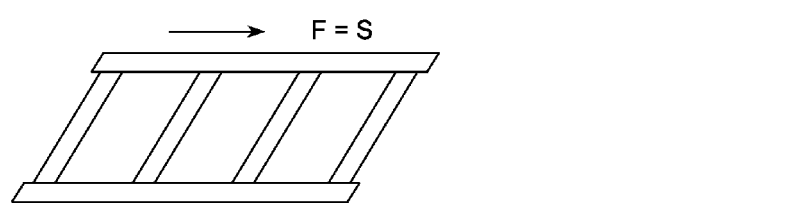
FIG. 1D
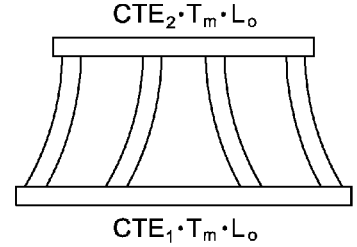
FIG. 1E

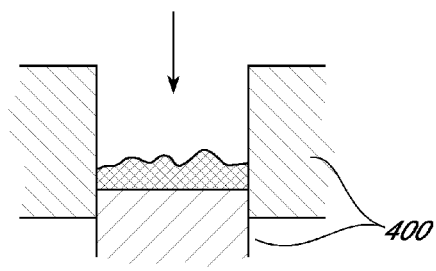 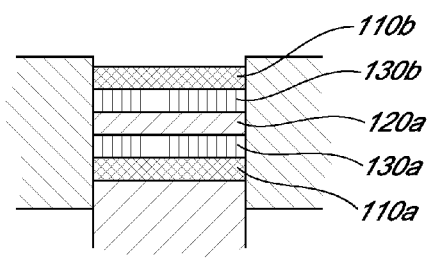
FIG. 5A          FIG. 5B
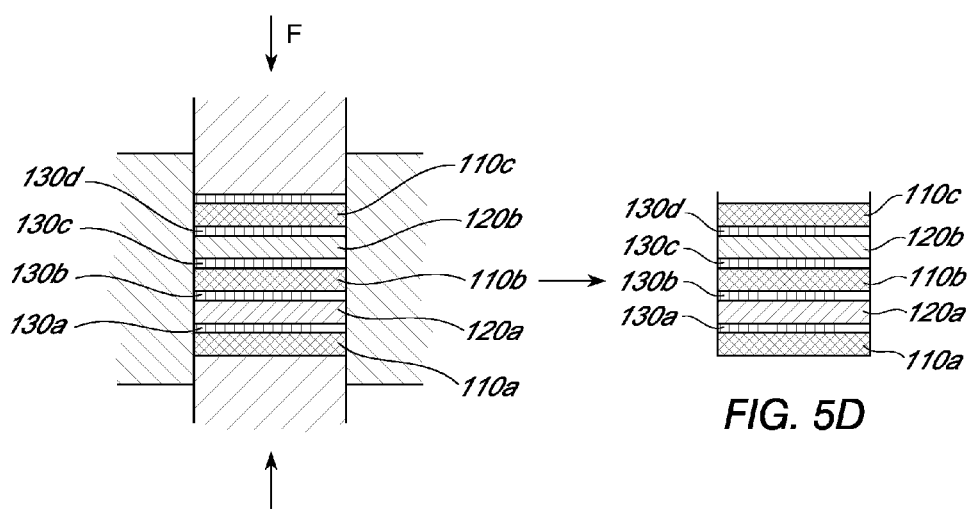
FIG. 5C          FIG. 5D

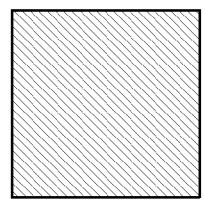
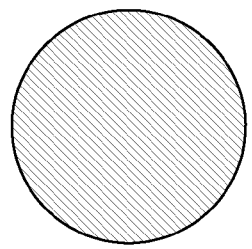
FIG. 9A          FIG. 9B
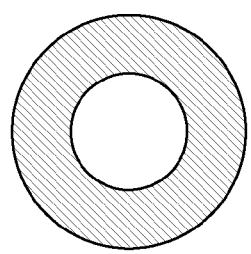
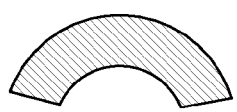
FIG. 9C          FIG. 9D

SECTION A-A

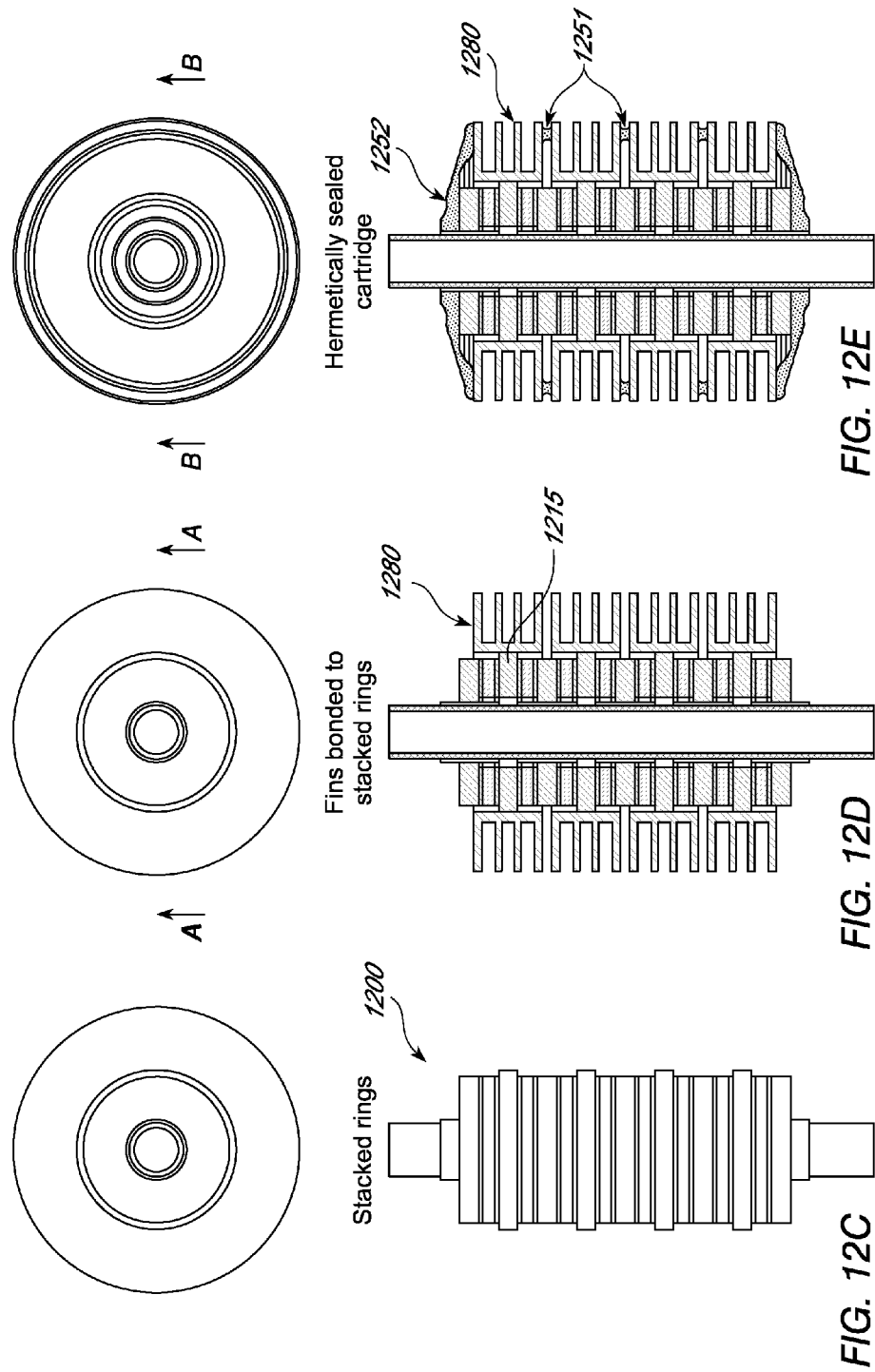

THERMOELECTRIC DEVICES WITH INTERFACE MATERIALS AND METHODS OF MANUFACTURING THE SAME

CLAIM OF PRIORITY

This application claims the benefit of U.S. Provisional Patent Application No. 61/561,177, filed Nov. 17, 2011, U.S. Provisional Patent Application No. 61,561,200, filed Nov. 17, 2011, and U.S. Provisional Patent Application No. 61/650,385, filed May 22, 2012. Each of the foregoing applications is incorporated in its entirety by reference herein.

BACKGROUND

1. Field of the Invention

The present application relates generally to thermoelectric devices, and more specifically to thermoelectric devices with interface materials.

2. Description of the Related Art

Thermoelectric (TE) devices are solid state heat engines and can operate in two modes as heat pumps as well as thermoelectric power generators (TEG). In general, heat pumps are used to move heat from a high temperature to a low temperature reservoir (cooling devices) or to move heat from a low temperature to a high temperature reservoir (heating devices). Heat pumps can use electrical power input to operate. Thermoelectric power generators typically operate in a reverse thermodynamic cycle and can use heat input to generate electricity. In these devices, heat can be moved through the thermoelectric device from a high temperature to a low temperature reservoir and a portion of this heat can be converted into electricity. Examples of high and low temperature reservoirs include, but are not limited to, gas or liquid heated/cooled heat exchangers, bodies undergoing exothermic or endothermic reactions, surfaces of vessels in which endothermic or exothermic reactions are occurring, and radiating surfaces.

In typical TE devices, a solid-state engine comprises p- and n-type thermoelectric materials (for example $Bi_2Te_3$, $Sb_2Te_3$, PbTe, SnTe, $CoSb_3$, $FeSb_3$ semiconductors, and their alloys and metals) that are electrically connected either in series or parallel connections. Materials commonly used for electrical connections are copper (Cu), nickel (Ni), iron (Fe), and other metals with high electrical and thermal conductivities. These electrical connections are referred to as hot and cold shunts. Hot shunts are electrical connections on the hot side of the thermoelectric device and cold shunts are electrical connections on the cold side of the thermoelectric device. Hot and cold shunts are commonly in thermal communication (e.g., in direct contact) with the high temperature and low temperature reservoirs respectively. In some instances, hot and cold shunts are radiatively coupled to the heat source and the heat sink, respectively.

During manufacture and normal operation of TE devices, shunts are periodically heated and cooled and undergo thermal expansion. The TE materials bonded to the shunts can expand differently with temperature. In general, elongation ($\in = \Delta L/L$) of TE materials and shunts is driven by each material's coefficient of thermal expansion (CTE) and local material temperature ($T_m$), $\in = CTE \cdot T_m$. Differences in CTE and $T_m$ between a shunt and TE material can result in increased stress at the interface between them. These stresses are usually the main failure mechanism and the main reason why TE materials are not sintered integrated with shunts.

SUMMARY

Certain embodiments described herein provide a thermoelectric device comprising at least one shunt, at least one thermoelectric element in thermal communication with the at least one shunt, and at least one interface material between the at least one shunt and the at least one thermoelectric element. The at least one interface material comprises a plurality of regions comprising a core material with each region of the plurality of regions separated from one another and surrounded by a shell material. The at least one interface material is configured to undergo deformation under at least one of the group consisting of: (i) a normal load between the at least one shunt and the at least one thermoelectric element and (ii) a shear load between the at least one shunt and the at least one thermoelectric element. The normal load is in a direction generally perpendicular to a plane that is generally parallel to the at least one shunt and the at least one thermoelectric element. The shear load is in a direction generally parallel to a plane that is generally parallel to the at least one shunt and the at least one thermoelectric element. The deformation reduces interface stress between the at least one shunt and the at least one thermoelectric element.

In certain embodiments, the at least one interface material can be rigidly bonded to the at least one shunt and the at least one thermoelectric element. Also, the at least one thermoelectric element and the at least one shunt can have different coefficients of thermal expansion.

In some embodiments, the interface material can comprise a composite material. For example, the composite material can comprise at least one of the group consisting of: Ni, Co, Mo, Fe, and Cu. As another example, the composite material can comprise at least a first material surrounded by at least one metal. The at least one metal can comprise at least one of the group consisting of: Ni, Mo, W, Ti, Co, Fe, Hf, Zr, and Bi.

In certain embodiments, the at least a first material can comprise at least one thermally and electrically conductive material. The at least one thermally and electrically conductive material can comprise carbon, graphite, silicon carbide, Si, W, TiC, or WC.

In some embodiments, the at least a first material can comprise at least one dielectric material. The at least one dielectric material can comprise at least one of the group consisting of: ceramic and glass. For example, the at least one dielectric material can comprise at least one of aluminum oxide, aluminum nitride, glass fits, and glass bubbles.

As one example, the composite material can comprise graphite coated with about 60 mass percentage to about 95 mass percentage of nickel. The graphite can substantially fill gaps between metal layers of nickel. Thus, the at least one interface material can be at least about 95% dense. Furthermore, in one example of the thermoelectric device, the at least one shunt can comprise copper, the at least one thermoelectric element can comprise a skutterudite, and the at least one interface material can comprise nickel-coated graphite.

In certain embodiments, the at least one interface material can comprise a diffusion barrier between the at least one shunt and the at least one thermoelectric element. For example, the diffusion barrier can comprise a metal shell. As another example, the diffusion barrier can comprise a metal coating over the shell material. As yet another example, the diffusion barrier can comprise a diffusion barrier material dispersed within the at least one interface material. In certain embodiments, the thermoelectric device can further comprise at least one diffusion barrier material between the at least one interface material and the at least one thermoelectric element. In such embodiments, the at least one diffusion barrier material can comprise at least one of the group consisting of: Ni, Mo, W, Fe, Co, Zr, Hf, and V.

In certain embodiments, the thermoelectric device can comprise at least one coating over the at least one shunt, the at least one thermoelectric element, and the at least one interface material. The at least one coating can comprise at least one of the group consisting of: oxides, ceramics, glass, enamel, paint, organic material, and epoxy. The thermal conductance of the at least one coating can be less than about 15% of the thermal conductance of the at least one thermoelectric element, and the electrical conductance of the at least one coating can be less than about 15% of the electrical conductance of the thermoelectric element. The at least one coating can be configured to hermetically seal the at least one shunt, the at least one thermoelectric element, and the at least one interface material. In some embodiments, the at least one coating can be configured to reduce sublimation of a material of the at least one thermoelectric element.

In certain embodiments, the thermoelectric device can comprise a stack of the at least one shunt, the at least one interface material, the at least one thermoelectric element, and a second interface material. The stack further can comprise a second shunt. The second interface material can be between the at least one thermoelectric element and the second shunt. The stack can further comprise a third interface material and a second thermoelectric element. The third interface material can be between the second shunt and the second thermoelectric element. The stack can further comprise a fourth interface material and a third shunt. The fourth interface material can be between the second thermoelectric element and the third shunt. The at least one thermoelectric element can comprise a p-type thermoelectric element and the second thermoelectric element can comprise an n-type thermoelectric element.

In some embodiments, the at least one thermoelectric element and the second thermoelectric element can comprise skutterudite. Also, the at least one shunt and the second shunt can comprise the same material. For example, the same material can comprise copper. The at least one interface material and the second interface material can comprise the same material. For example, the same material can comprise nickel-coated graphite. As one example, the at least one shunt and the second shunt can comprise copper, the at least one interface material and the second interface material can comprise nickel-coated graphite, and the at least one thermoelectric element and the second thermoelectric element can comprise skutterudite.

In certain embodiments, the thermoelectric device can comprise a stack of the at least one shunt, the at least one interface material, and the at least one thermoelectric element. The stack can have a direction of current flow and a cross-section generally perpendicular to the direction of current flow that is square, circular, annular, or part of a ring. In some embodiments, each of the at least one shunt and a second shunt can have a direction of current flow and a cross-section generally perpendicular to the direction of current flow. The cross-section of the at least one shunt and the cross-section of the second shunt can have different geometries.

In certain embodiments, the thermoelectric device comprises at least one shunt and at least one thermoelectric element in thermal and electrical communication with the at least one shunt. The device comprises a structure comprising a plurality of regions comprising a core material with each region of the plurality of regions separated from one another and surrounded by a shell material. The structure is configured to undergo deformation under at least one of the group consisting of: (i) a normal load between the at least one shunt and the at least one thermoelectric element, and (ii) a shear load between the at least one shunt and the at least one thermoelectric element. The normal load can be in a direction generally perpendicular to a plane that is generally parallel to an interface between the at least one shunt and the at least one thermoelectric element. The shear load can be in a direction generally parallel to the plane that is generally parallel to the interface between the at least one shunt and the at least one thermoelectric element. In certain embodiments, the at least one shunt can comprise the structure. In addition, current can flow in a direction perpendicular to the interface.

Certain embodiments described herein provide a method of forming a thermoelectric device. The method comprises loading materials into a die. The materials comprise at least one powder of at least one shunt material, at least one powder of a thermoelectric material, and particles comprising at least one powder of at least one core material. The particles are surrounded by at least one shell material. The method further comprises forming the materials in the die into at least one shunt, at least one interface material, and at least one thermoelectric element. As one example, forming the materials into at least one shunt, at least one interface material, and at least one thermoelectric element can comprise pressing and sintering the materials. As another example, forming the materials into at least one shunt, at least one interface material, and at least one thermoelectric element can comprise at least one of the group consisting of: hot pressing, HIP, spark plasma sintering, metal injection molding, cold pressing followed by sintering, hot or cold rolling, and microwave sintering.

In certain embodiments, the at least one core material can comprise graphite and the at least one shell material can comprise nickel. In addition, the thermoelectric device can comprise a stack of a first shunt, a first interface material, at least one thermoelectric material, a second interface material, and a second shunt. The first shunt, the first interface material, the at least one thermoelectric material, the second interface material, and the second shunt can be formed simultaneously with one another. In some embodiments, the first shunt can comprise copper, the first interface material can comprise nickel-coated graphite, the at least one thermoelectric material can comprise at least one skutterudite, the second interface material can comprise nickel-coated graphite, and the second shunt can comprise copper. Forming the materials into at least one shunt, at least one interface material, and at least one thermoelectric element can comprise bonding adjacent materials together and forming a solid support structure in the at least one interface material with substantially limited diffusion of the shell material into the core material.

Certain embodiments described herein provide a method of forming an interface material for a thermoelectric device. The method comprises providing at least one powder of at least one core material. The at least one core material is surrounded by at least one shell material. The method further comprises forming the interface material by applying at least one of the following to the at least one powder: hot rolling, hot pressing, spark plasma sintering, metal injection molding, and cold pressing followed by sintering.

BRIEF DESCRIPTION OF THE DRAWINGS

FIGS. 1B-1E schematically illustrate the basic concept and function of certain embodiments of interface materials as described herein.

FIGS. 5A-5D schematically illustrate an example process of sintering p-n thermoelectric materials with shunts.

FIGS. 9A-9D show example cross-sections of stacks in accordance with certain embodiments described herein.

FIGS. 12C-12E schematically illustrate hermetically sealing an example cartridge prepared from thermoelectric stacks by an example method of sealing end shunts and areas between finned surfaces.

DETAILED DESCRIPTION

Figure 1A:
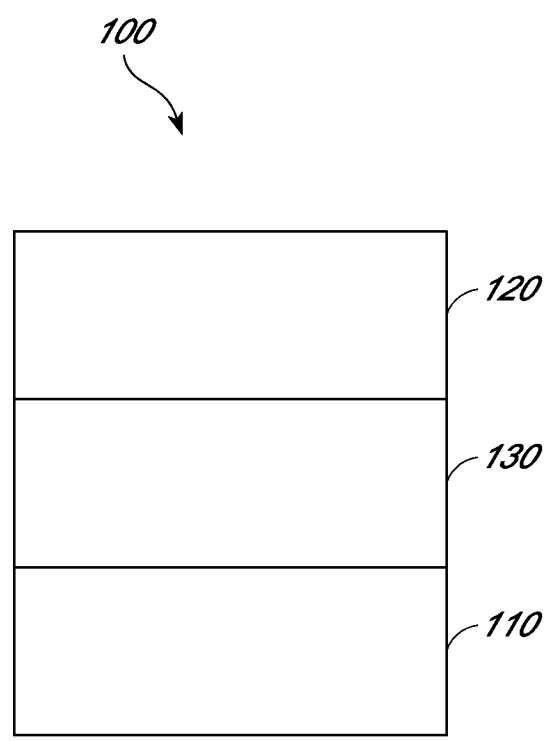
FIG. 1A schematically illustrates an example thermoelectric device in accordance with certain embodiments described herein.

Several methods can be used to reduce interface stresses between shunts and thermoelectric materials in thermoelectric devices. For example, thermoelectric materials can be bonded, e.g., brazed, soldered, or diffusion bonded, to shunts with CTE selected to match the CTE of the thermoelectric materials. Thermoelectric materials can also be bonded to compliant pads made of composite material wherein one of the phases can have a melting point lower than the operating temperature of the hot shunt. During operation, this phase can melt and the shunt material can yield (e.g., undergo plastic deformation) and reduce stress at the interface. Other methods for reducing stress at the shunt-thermoelectric material interface can be based on providing sliding contacts by placing metal foils, graphite foils, or metal meshes between the shunt and thermoelectric material. In these cases, materials placed at the interface may not react with the thermoelectric materials. Another method to reduce interface stress can include the use of a liquid phase medium at the interface. For example, materials used to connect the shunt and thermoelectric material can go through a phase transition and remain liquid during normal operation. Example methods are discussed in, e.g., Mitsuru Kambe et al., "Encapsulated Thermoelectric Modules and Compliant Pads for Advanced Thermoelectric Systems," *J. Electronic Materials*, Vol. 39, No. 9, 1418-21 (2010) and U.S. Patent Application Publication No. US 2006/0005873 A1 to Kambe et al.

However, the issue of stresses that can develop in thermoelectric devices between the shunt and the thermoelectric material during sintering of thermoelectric materials has not been addressed elsewhere in any way similar to certain embodiments described herein. As described herein, certain embodiments provide thermoelectric devices with reduced interface stress and methods of reducing interface stress.

Certain embodiments have various advantages. For example, the use of certain embodiments of thermoelectric devices with interface materials and methods of manufacturing the same can reduce stresses developed in thermoelectric materials and can advantageously allow for fabrication of stacks of thermoelectric materials already integrated with hot and cold shunts. Such structures and methods can enable manufacturing of net shape parts which comprise dissimilar materials. Thus, certain embodiments can significantly reduce manufacturing cost through improving material yields and integrating many manufacturing steps. In addition, the use of certain embodiments can advantageously improve the mechanical properties of thermoelectric devices.

Furthermore, the use of certain embodiments with interface materials can advantageously enable manufacturing of stacks which may have only or substantially only their inner diameter surface or outer diameter surface exposed to the environment. The reduced number of surfaces and interfaces can enable application of coatings for hermetic sealing and sublimation suppression.

This disclosure is separated into Sections 1-6 for clarity. However, the teachings and example embodiments disclosed in each section can be used in conjunction with those of other sections.

Section 1. Interface Materials and Thermoelectric Devices with Interface Materials FIG. 1A schematically illustrates an example thermoelectric device 100 in accordance with certain embodiments described herein. The thermoelectric device 100 can comprise at least one shunt 110 and at least one thermoelectric element 120. The at least one thermoelectric element 120 can be in thermal and electrical communication with the at least one shunt 110. The thermoelectric device 100 can also include at least one interface material 130 between the at least one shunt 110 and the at least one thermoelectric element 120. In addition, the at least one interface material 130 can be configured to deform under at least one of the group consisting of (i) a normal load between the at least one shunt 110 and the at least one thermoelectric element 120 and (ii) a shear load between the at least one shunt 110 and the at least one thermoelectric element 120.

The thermoelectric device 100 can include any thermoelectric device or portion of thermoelectric device known in the art or yet to be developed, e.g., a stack or stacks of thermoelectric materials integrated with at least one shunt, a heat engine operating as a heat pump, or a heat engine operating as a thermoelectric power generator.

The at least one shunt 110 can include a hot shunt or a cold shunt. For example, a hot shunt can be an electrical connection on the hot side of the thermoelectric device 100 (e.g., the side at a higher temperature than that of the cold side). Likewise, a cold shunt can be an electrical connection on the cold side of the thermoelectric device 100 (e.g., the side at a lower temperature than that of the hot side). The at least one shunt 110 can comprise a material selected for an intended application of use. For example, the material can include a material with high electrical and thermal conductivities, e.g., copper, nickel, iron, or other metals with high electrical and thermal conductivities. In general, materials with higher conductivities can result in better performance, e.g., with respect to heat or electron transfer, of the thermoelectric device. However, materials with lower conductivities may be selected for ease of manufacture, sintering temperature matching that of the thermoelectric element, cost, strength, or other properties less related to heat or electron transfer. The shape and dimensions of the shunt can be similar to the shape and dimensions of shunts known in the art, and also can be modified according to the intended application of use. In addition, in certain embodiments, the at least one shunt 110 can comprise the interface material 130.

In certain embodiments, the thermoelectric element 120 is in thermal and electrical communication with the at least one shunt 110. The thermoelectric element 120 can comprise thermoelectric materials known in the art or yet to be developed. The thermoelectric element 120 can comprise a p-type thermoelectric or an n-type thermoelectric material. Example materials include $Bi_2Te_3$, $Sb_2Te_3$, PbTe, SnTe, $CoSb_3$, $FeSb_3$ semiconductors, and their alloys and metals. In some embodiments, the thermoelectric element 120 and the shunt 110 can have different coefficients of thermal expansion. For example, the thermoelectric element 120 can comprise skutterudite materials having a CTE within the range of about $12 \times 10^{-6}$/K to about $16 \times 10^{-6}$/K, while the shunt 110 can comprise copper having a CTE within the range of about $16.5 \times 10^{-6}$/K to about $25 \times 10^{-6}$/K over the useable temperature range (maximum about 600° C.). As another example, the thermoelectric element 120 can comprise lead telluride TE materials having a CTE within the range of about $19 \times 10^{-6}$/K to about $22 \times 10^{-6}$/K, while the shunt 110 can comprise iron having a CTE within the range of about $12 \times 10^{-6}$/K to about $16 \times 10^{-6}$/K over the useable temperature range (maximum about 600° C.). Furthermore, the shape and dimensions of the thermoelectric element 120 can be similar to the shape and dimensions of thermoelectric elements known in the art, and also can be modified according to the intended application of use.

In accordance with certain embodiments as described herein, the structure of the interface of the at least one shunt 110 and the at least one thermoelectric element 120 advantageously can reduce stresses developed during the manufacturing of thermoelectric devices and during the use of thermoelectric devices. For example, FIGS. 1B-1E schematically illustrate the basic concept and function of certain embodiments of the interface. In a first approximation, the structure of the interface 230 can be viewed as a set of columns 235 supporting two plates representing the thermoelectric element 220 and the shunt 210. The interface 230 can then be conceptualized as a structure that would deform under normal (N) and shear (S) loads that develop between the thermoelectric element 220 and the shunt 210. The normal loads are those in a direction generally perpendicular to the interface 230 (e.g., perpendicular to a plane that is generally parallel to the shunt 210 and the thermoelectric element 220). For certain embodiments of a thermoelectric device, the normal loads can be those in a direction generally parallel to the direction of current flow between the shunt 210 and the thermoelectric element 220. The shear loads are those in a direction generally parallel to the interface 230 (e.g., parallel to a plane that is generally parallel to the shunt 210 and the thermoelectric element 220). For certain embodiments of a thermoelectric device, the shear loads can be those in a direction generally perpendicular to the direction of current flow between the shunt 210 and the thermoelectric element 220. The origin of these loads can be external forces F, as shown in FIGS. 1C and 1D. The origin of these loads can also be mismatch in thermal expansion of the shunt 210 and the thermoelectric element 220, as shown in FIG. 1E. The elongation ($\in = \Delta L/L$) of the shunt 210 and of the thermoelectric element 220 can be related to each material's CTE and local material temperature $T_m$. The sizes of the columns 235 can be selected in such a way that they can deform under external and internal loads, and can reduce stress within the thermoelectric element 220 by compensating for differences in the thermal expansion of the shunt 210 and the thermoelectric element 220.

Thus, in certain embodiments as shown in FIG. 1A, the thermoelectric device 100 can comprise at least one interface material 130 between the at least one shunt 110 and the at least one thermoelectric element 120. In certain embodiments, the at least one interface material 130 can be bonded, e.g., physically bonded or joined, between the at least one shunt 110 and the at least one thermoelectric element 120, e.g., to form a monolithic structure. For example, in certain embodiments, the at least one interface material 130 can be rigidly bonded between the at least one shunt 110 and the at least one thermoelectric element 120 such that there is good adhesion of the at least one interface material 130 and the at least one shunt 110 and of the interface material 130 and the at least one thermoelectric element 120, e.g., substantially no sliding or melting of the at least one interface material 130. In some embodiments, the at least one interface material 130 is not brazed between the at least one shunt 110 and the at least one thermoelectric element 120. However, in other embodiments, the at least one interface material 130 may be brazed between the at least one shunt 110 and the at least one thermoelectric element 120.

Figure 1F:
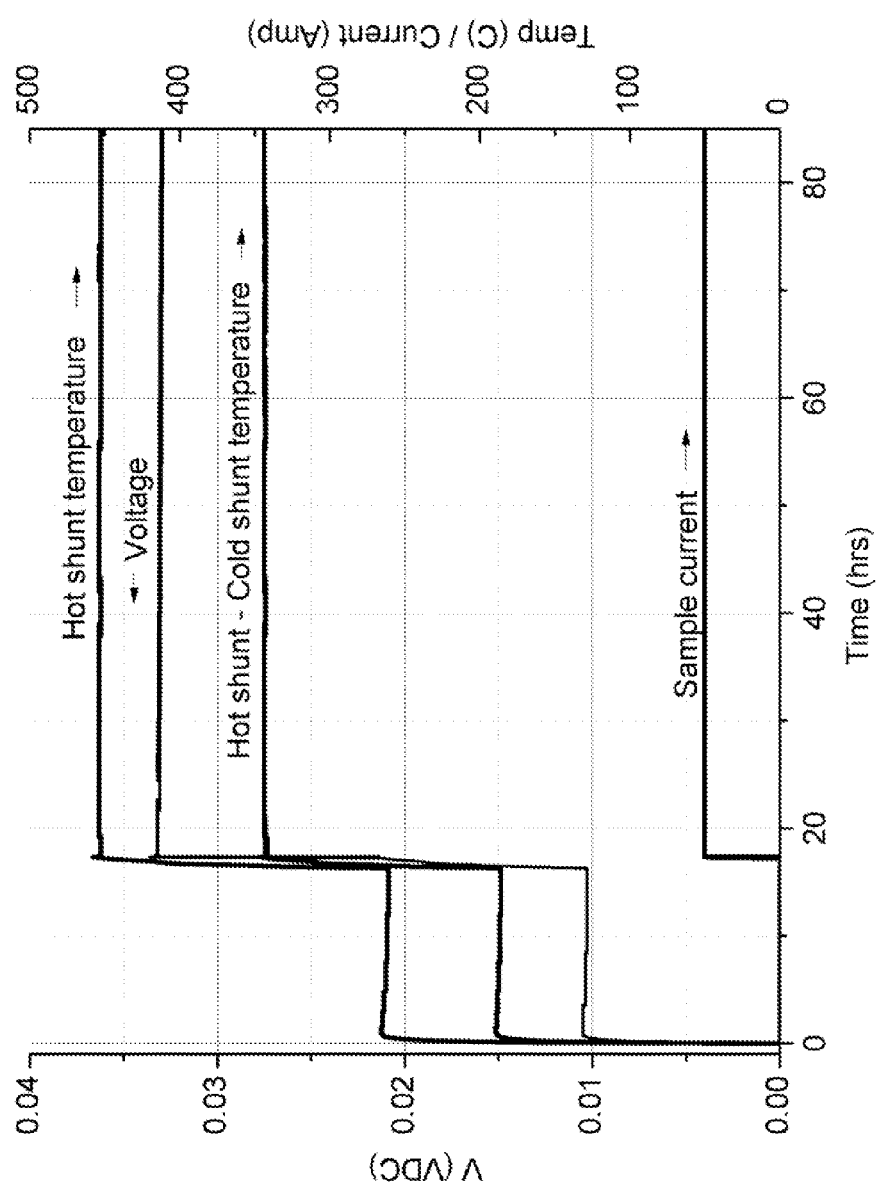
FIG. 1F is a plot of the voltage, current, and temperatures of a hot and cold shunt as a function of time for an example thermoelectric device in accordance with certain embodiments described herein.

The at least one interface material 130 can be configured to deform under a normal load between the at least one shunt 110 and the at least one thermoelectric element 120, or under a shear load between the at least one shunt 110 and the at least one thermoelectric element 120, or under both. In various embodiments, the at least one interface material 130 can be configured to deform without substantial degradation of properties of the thermoelectric device 100, e.g., mechanical properties or performance of the thermoelectric device 100. For example, FIG. 1F shows a plot of the voltage, current, hot shunt temperature, and the hot shunt temperature minus the cold shunt temperature for an example thermoelectric device in accordance with certain embodiments described herein. As shown in the plot, the voltage, current, and temperatures of the hot and cold shunts did not substantially change after at least about 80 hours of use. A support structure, e.g., comprising metal, can help achieve this result.

Thus, in certain embodiments, the interface material 130 can comprise a support structure comprising a sufficiently rigid material to provide mechanical support to the interface material 130 (which can in certain embodiments be referred to as a skeleton structure). For example, foams of Ni, Co, Mo, Fe, Cu, or other metals can be used as interface materials 130. The metal support structure (e.g., skeletons) of these foams can have low thermal and electrical conductance due to low metal volume. In order to improve electrical and thermal conductivity in certain embodiments, areas within the skeleton (e.g., voids or holes) can contain one or more conductive materials to form a core-shell structure, e.g., a core material surrounded by a shell material. For example, the at least one interface material 130 can comprise a plurality of regions comprising a core material within each region of the plurality of regions separated from one another and surrounded by a shell material. For example, filled pore composite structures can be made by starting with metal-coated powders, such as nickel-coated graphite. Nickel-coated graphite can be used as a filler material for gaskets and electromagnetic isolation and as an abradable seal in turbines. For example, Sulzer Metco Canada, located in Alberta, Canada, sells several varieties varying in shape from spherical to acicular (e.g., needle-shaped), in size from about 10 µm to about 200 µm, and in mass fraction of Ni from about 60% to about 95%.

Figure 2:
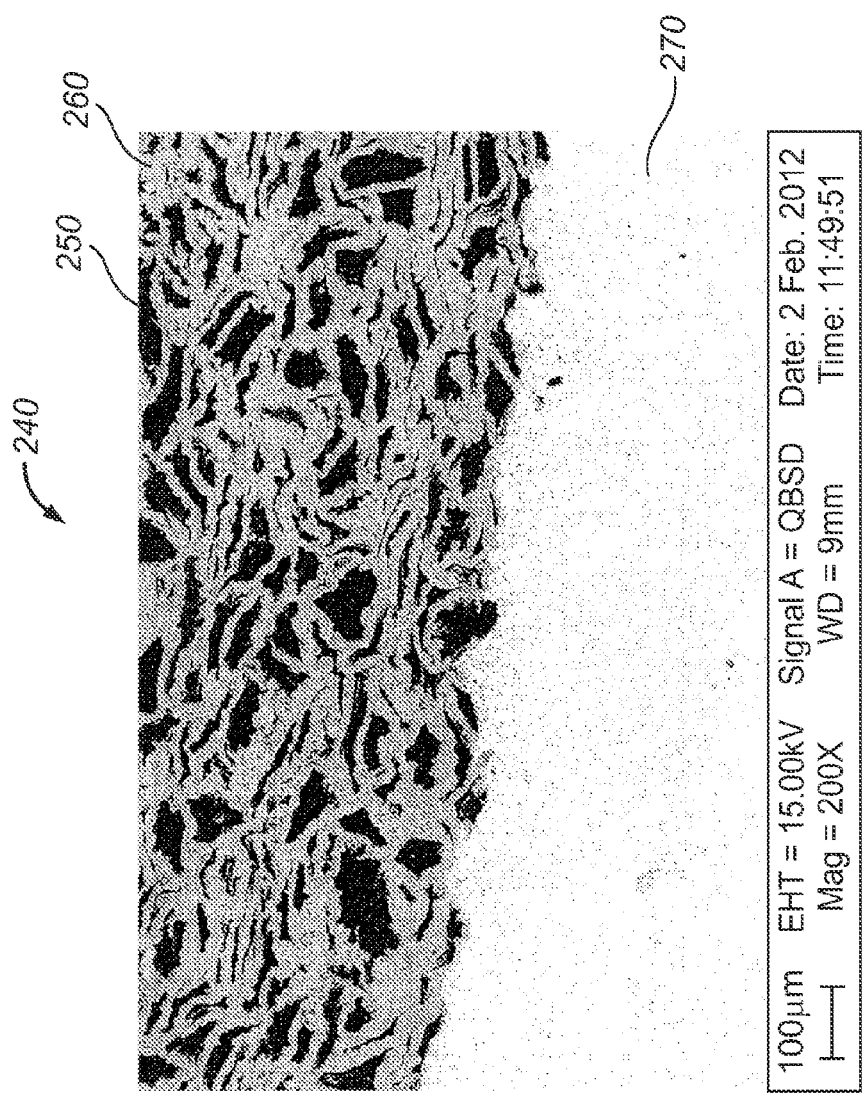
FIG. 2 shows an SEM micrograph of an example Ni coated graphite-skutterudite interface stack.

In thermoelectric applications, nickel-coated graphite, Mo-coated graphite, Co-coated graphite, Fe-coated graphite, and similarly structured materials can be sintered to form structures of interface materials 130 such as the example structure shown in FIG. 2. To prepare this example structure, powder of graphite coated with Ni (NiG) was loaded in a uniaxial die with thermoelectric materials and materials used for shunts (all in the form of powders), and subsequently pressed and sintered. The structure 240 in FIG. 2 is graphite 250 (black areas) coated with about 60 mass percent to about 75 mass percent of nickel 260. In some embodiments, the composite material of the interface material 130 can comprise graphite coated with about 60-80 mass percent of nickel, about 60-85 mass percent of nickel, about 60-90 mass percent of nickel, or about 60-95 mass percent of nickel. The light colored area 270 at the bottom of the image in FIG. 2 is p-type skutterudite thermoelectric material. As shown in FIG. 2, the metal coated graphite powder results in a structure that is principally described in FIGS. 1B-1E. As shown, graphite 250 can substantially fill the gaps between metal layers of nickel 260. Thus, in certain embodiments, the interface material 130 can be substantially fully dense, e.g., without gaps, voids, holes, etc. For example, the interface material 130 can be at least about 90% dense, at least about 93% dense, at least about 95% dense, at least about 96% dense, at least about 97% dense, at least about 98% dense, at least about 99% dense, or about 100% dense. In some embodiments, this percentage can refer to the amount of the interface material 130 that is without gaps, voids, or holes between the core and shell materials. For example, at least about 95% dense can refer to less than or equal to about 5% gaps, voids, or holes between the core material, e.g., graphite, and the shell material, e.g., nickel; or less than or equal to about 5% gaps, voids, or holes in the shell material itself; or less than or equal to about 5% gaps, voids, or holes in the core material itself; or less than or equal to about 5% gaps, voids, or holes in the core material, shell material, and between the core and shell materials.

Figure 3:
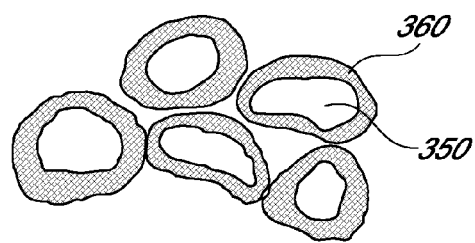
FIG. 3 schematically illustrates an example core-shell structure of metal coated powders.

Independent of the choice for the materials of the shunt 110 and thermoelectric element 120, the interface material 130 can comprise at least a first material surrounded by, e.g., coated with, at least a second material. As an example, the interface material 130 can be made using powders of a first material A coated with a second material B, as shown in FIG. 3. For example, the first material of the core 350 can comprise at least one thermally and electrically conductive material such as carbon, graphite, silicon carbide, Si, W, TiC, WC, and similar materials. Alternatively, the first material of the core 350 may comprise at least one dielectric material such as a ceramic or a glass, for example aluminum oxide, aluminum nitride or glass fits. The core 350 could also comprise hollow glass, ceramic spheres, or bubbles, such as glass bubbles manufactured by 3M™. Other hollow shaped materials can be used. For example, the core 350 can comprise a porous material filled with a gas, and without oxygen in some embodiments, or a hollow shaped material with a sponge-like interior.

The second material B can comprise any metal or alloy, such as Ni, Mo, W, Ti, Co, Fe, Hf, Zr, Bi, etc., that can form a shell 360 around the core 350 comprising the first material A. The choice of material for the shell 360 can be made such that during the sintering process, the shells 360 from adjacent particles bond, forming a solid skeleton structure with substantially limited diffusion into the material of the core 350. In this way, the core 350 and the shell 360 may not form high-yield strength bonds between each other and the material may be able to deform elastically or plastically, as shown in FIGS. 1B-1E. The material of the shell 360 can advantageously bond well to both materials adjacent to it in the stack, e.g., to the material of the shunt 110 on one side and to the outer layer on the side of the thermoelectric element 120. This outer layer may be the thermoelectric element 120 itself or a diffusion barrier placed between the interface material 130 and the thermoelectric element 120. In the former case, where the composite interface material 130 bonds directly to the thermoelectric element 120, the interface material 130 can act as a diffusion barrier as well, preventing diffusion of atoms between the material of the shunt 110 and the material of the thermoelectric element 120.

Figure 4A:
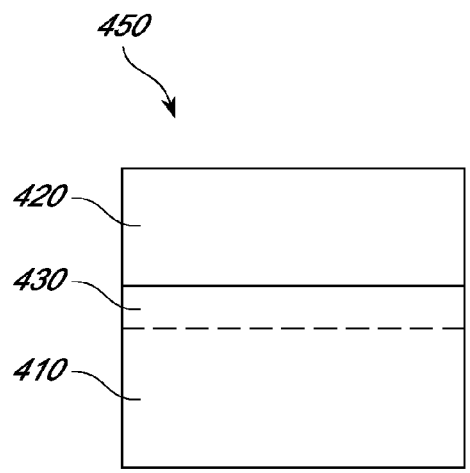
FIG. 4A schematically illustrates an example thermoelectric device in accordance with certain embodiments described herein.

In certain embodiments, the at least one shunt can comprise the interface material. For example, as shown in FIG. 4A, certain embodiments of a thermoelectric device 450 comprise at least one shunt 410 and at least one thermoelectric element 420 in thermal and electrical communication with the at least one shunt 410. The device 450 comprises a structure 430 configured to undergo deformation under at least one of the group consisting of: (i) a normal load between the at least one shunt 410 and the at least one thermoelectric element 420, and (ii) a shear load between the at least one shunt 410 and the at least one thermoelectric element 420. In certain embodiments, the at least one shunt 410 comprises the structure 430. In addition, in accordance with certain embodiments described herein, the structure 430 can comprise a plurality of regions comprising a core material with each region of the plurality of regions separated from one another and surrounded by a shell material, e.g., see FIG. 3.

In certain embodiments, the normal load can be in a direction generally perpendicular to a plane that is generally parallel to an interface between the at least one shunt 410 and the at least one thermoelectric element 420. The shear load can be in a direction generally parallel to the plane that is generally parallel to the interface between the at least one shunt 410 and the at least one thermoelectric element 420. In some embodiments, current flows in a direction perpendicular to the interface.

Section 2. Use of Interface Materials in Thermoelectric Devices and Manufacturing Methods As described in Section 1, certain embodiments of the interface materials 130 can be used to reduce stress at the interfaces between the thermoelectric elements 120 and shunts 110. The source of stress can include mismatch in thermal expansion of the shunt 110 and the thermoelectric element 120 under typical operating conditions, as well as thermal expansion mismatch during the manufacture of the assembly or assemblies of the thermoelectric element 120 and the shunt 110. The use of the interface materials 130 described in Section 1 can enable new thermoelectric devices 100 and the use of new methods of manufacturing thermoelectric devices 100 as described herein.

Figure 4B:
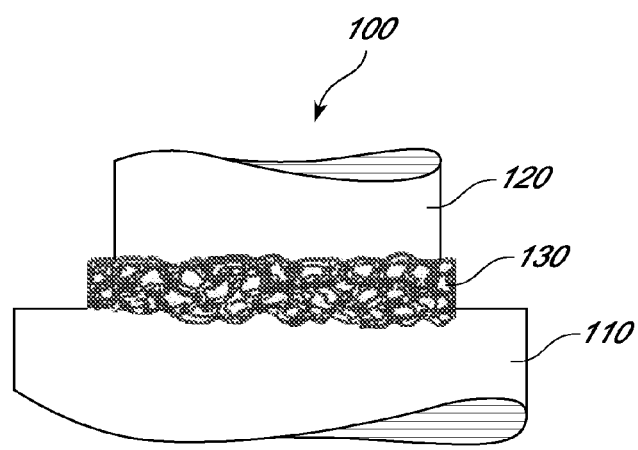
FIG. 4B schematically illustrates an example thermoelectric device comprising a shunt, thermoelectric element, and an interface material prepared by bonding.

The interface materials 130 can be prepared separately by hot rolling, hot pressing, spark plasma sintering (SPS), metal injection molding, hot isostatic pressing (HIP), or cold pressing or tape casting followed by sintering, then cut into appropriately sized parts and bonded to shunts 110 and thermoelectric elements 120. An example resultant structure is shown in FIG. 4B, e.g., a thermoelectric device 100 comprising a shunt 110, a thermoelectric element 120, and an interface material 130 between the shunt 110 and the thermoelectric element 120.

Alternatively, the interface materials 130 can be prepared simultaneously with the thermoelectric elements 120. In this case, the materials for the thermoelectric elements 120 and interface materials 130 can be co-pressed and sintered (e.g., hot pressing, SPS, metal injection molding, cold pressing or tape casting and sintering, HIP, etc.). The interface material 130 can then be bonded to the hot or cold shunt 110 by soldering, brazing diffusion bonding, friction welding, welding, or similar methods. Alternatively, solid interface materials 130 can be pressed with powder for the shunt 110 and powder for the thermoelectric element 120 as disclosed herein to form monolithic stacks.

Figure 5E:
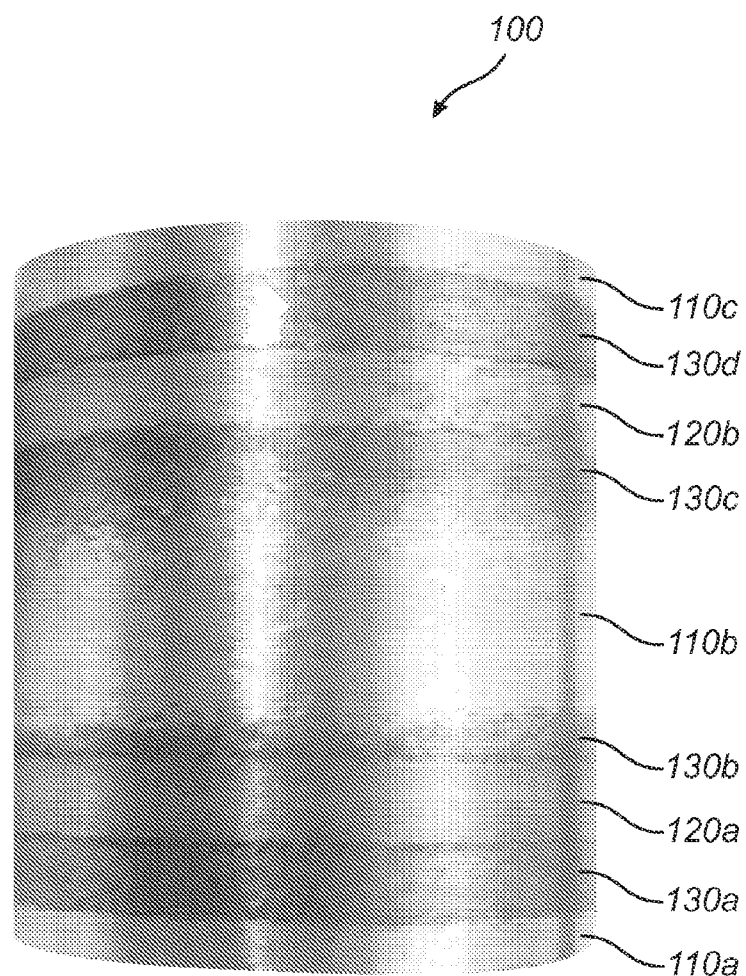
FIG. 5E shows an example stack of p-n materials with shunts pressed by spark plasma sintering (SPS).

Alternatively, the use of certain embodiments of interface materials 130 can allow simultaneous sintering of the thermoelectric element 120 and shunts 110. FIGS. 5A-5D show an example process of loading a form 400 with powders in order to sinter shunts 110 with integrated thermoelectric elements 120. As shown in FIG. 5A, the form 400 is loaded with loose powder. As shown in FIG. 5B, powders are stacked to fill the form 400 in the following sequence: material for the shunt 110a, interface material 130a, material for a p (or n) type thermoelectric element 120a, interface material 130b, and material for the shunt 110b. The form 400 can further be loaded with powders for an additional interface material 130c, material for an n (or p) type thermoelectric element 120b, interface material 130d, and material for the shunt 110c. Such a stack of powdered materials can then be pressed and sintered as shown in FIG. 5C, resulting in the thermoelectric stack shown schematically in FIG. 5D and as a photograph in FIG. 5E. The materials used to prepare the example stack shown in FIG. 5E are as follows: the shunts 110 are made of Cu; the interface materials 130 are made of NiG; and thermoelectric elements 120 are p- and n-type skutterudites. In this disclosure, all subassemblies made in this way can be referred to as stacks. The stack shown in FIG. 5E was prepared using spark plasma sintering in a 14 mm diameter cylindrical graphite form or die. Other compaction and sintering methods may be used without loss of performance or functionality such as HIP, hot pressing, metal injection molding, hot or cold rolling, microwave sintering, cold pressing and sintering and similar methods. The materials for the interface material 130 and the shunt 110 may be advantageously chosen such that they sinter at the same temperature as the material for the thermoelectric element 120.

Figure 6:
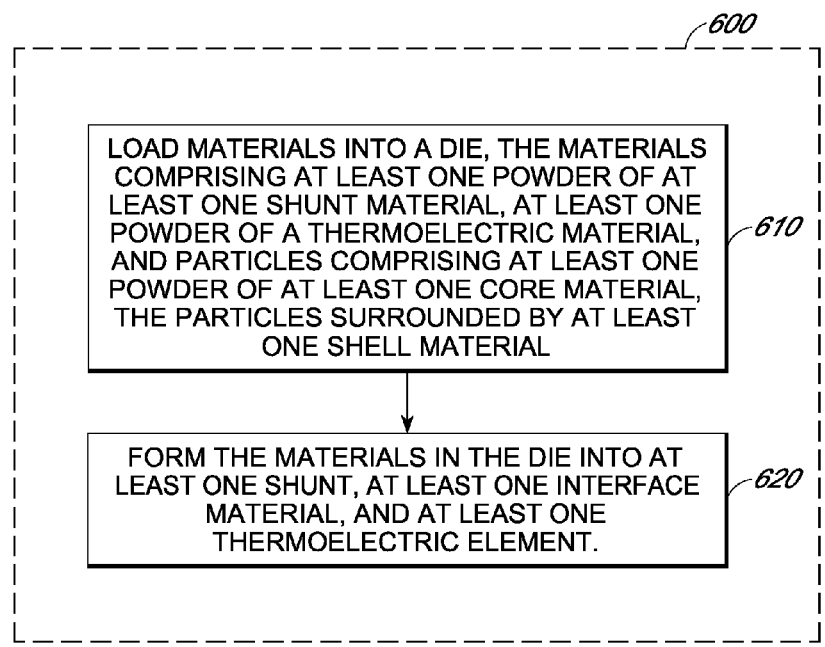
FIG. 6 is a flowchart of an example method of forming a thermoelectric device in accordance with certain embodiments described herein.

FIG. 6 is a flowchart of an example method 600 of forming a thermoelectric device 100 in accordance with certain embodiments described herein. The method 600 comprises loading materials into a die. The materials comprise at least one powder of a shunt material, at least one powder of a thermoelectric material, and particles comprising at least one powder of at least one core material. The particles can be surrounded by, e.g., coated with, at least one shell material, as shown in operational block 610 of FIG. 6. The method 600 also comprises forming the materials in the die into at least one shunt, at least one interface material, and at least one thermoelectric element, as shown in operational block 620. The method 600 can form a thermoelectric device 100 in accordance with certain embodiments disclosed herein. For example, forming the materials into at least one shunt 110, at least one interface material 130, and at least one thermoelectric element 120 can comprise bonding adjacent materials, e.g., adjacent powder particles, together and forming a solid support (e.g., skeleton) structure in the at least one interface material 130 with substantially limited diffusion of the shell material into the core material. The at least one core material can comprise graphite and the least one shell material can comprise nickel. See, e.g., FIG. 2.

In some embodiments, forming the materials in the die into at least one shunt 110, at least one interface material 130, and at least one thermoelectric element 120 can comprise pressing and sintering the materials, e.g., powders. In other embodiments, forming the materials into at least one shunt 110, at least one interface material 130, and at least one thermoelectric element 120 can comprise hot pressing, HIP, spark plasma sintering, metal injection molding, cold pressing followed by sintering, hot or cold rolling, or microwave sintering.

In some embodiments, the thermoelectric device 100 can comprise a stack of a first shunt 110a, a first interface material 130a, at least one thermoelectric material 120a, a second interface material 130b, and a second shunt 110b. The first shunt 110a, the first interface material 130a, the at least one thermoelectric material 120a, the second interface material 130b, and the second shunt 110b can be formed simultaneously with one another. The first shunt 110a can comprise copper, the first interface material 130a can comprise nickel-coated graphite, the at least one thermoelectric material 120a can comprise at least one skutterudite, the second interface material 130b can comprise nickel-coated graphite, and the second shunt 110b can comprise copper. The thermoelectric device 100 can comprise other materials and combinations of materials, such as those described herein. For example, the first shunt 110a and the second shunt 110b can comprise different materials from one another, and the first interface material 130a and the second interface material 130b can comprise different materials from one another.

Stacks can also be prepared by using solid shunts 110 instead of powders. In the process described in FIGS. 5A-5D, the powder used for preparing the first or second shunt 110 can be replaced by a solid part. The shunts 110 can be placed in the form 400 and powders can be used for interface materials 130 and for preparation of thermoelectric elements 120. Once the stacking process is complete, the part can be compacted and sintered using SPS, HIP, hot pressing, metal injection molding, cold pressing and sintering, and similar methods.

Stacks can also be prepared by using solid thermoelectric elements 120. In the process described in FIGS. 5A-5D, the powder used for preparing the thermoelectric elements 120 can be replaced by a solid part. The pre-sintered (or cast or otherwise formed) thermoelectric element 120 can be placed in the form 400 in sequence with the powders used for the interface material 130 and shunts 110. Once the stacking process is complete, the part can be compacted and sintered using SPS, HIP, hot pressing, metal injection molding, cold pressing and sintering, and similar methods.

A layer or layers, e.g., thick layer or thick layers, of interface materials 130 can be sprayed onto solid shunts 110, solid thermoelectric elements 120, or both. Spraying methods include, but are not limited to, spraying of aerosols and plasma spraying. Thermoelectric elements 120 or shunts 110 can then be pressed or bonded onto these interface materials 130, as described herein. Plasma spraying, a method that can be used for preparing NiG coatings, can be adapted for thermoelectric applications in accordance with the description herein.

Section 3. Diffusion Barrier

Figures 7A, 7B:
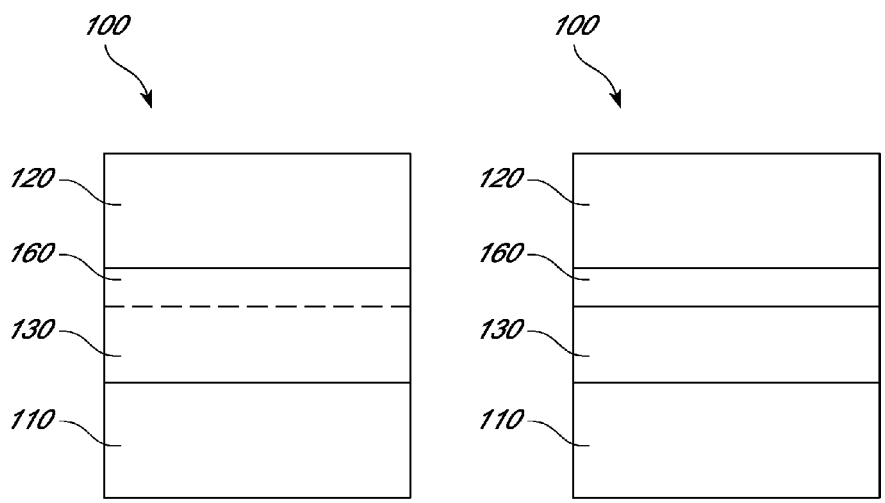
FIGS. 7A and 7B schematically illustrate examples of thermoelectric devices with diffusion barriers in accordance with certain embodiments described herein.

In certain embodiments, the function of a diffusion barrier can be to reduce or prevent diffusion of atoms from the shunt 110 or interface materials 130 into the thermoelectric element 120 and from the thermoelectric element 120 into the shunt 110. If such diffusion occurs, the properties of the thermoelectric element 120 can be modified in certain embodiments, typically in an adverse way. An example of such detrimental diffusion is Cu diffusion into PbTe. Cu is an ionic conductor. It can readily diffuse in PbTe and by doing so, it can dope the thermoelectric element 120 to be n-type. Thus, in certain embodiments as shown schematically in FIGS. 7A and 7B, the thermoelectric device 100 can comprise a diffusion barrier 160 between the shunt 110 and the thermoelectric element 120 which helps inhibit (e.g., reduces or substantially prevents) atomic diffusion among the shunt 110 and the interface material 130 or among the thermoelectric element 120 and the interface material 130. In the example shown in FIG. 7A, the interface material 130 comprises the diffusion barrier 160 between the at least one shunt 110 and the at least one thermoelectric element 120. Although the diffusion barrier 160 is shown in FIG. 7A near the interface of the thermoelectric element 120, a diffusion barrier 160 can also be at the interface near the shunt 110 or throughout the interface material 130. The diffusion barrier 160 can have a high thermal and electrical conductance, which can help prevent reduction of the performance of the thermoelectric device in some embodiments.

As described in Section 1, some of the composite materials that are used for interface materials 130 can be made from graphite or silicon carbide particles coated with Ni, Mo, W, Fe, Co, etc. In some such examples, the metal coating can form a shell that can act as a diffusion barrier 160. Thus, in certain embodiments, the diffusion barrier 160 comprises the metal support structure (e.g., skeleton) of the interface material 130. In some embodiments, the diffusion barrier 160 comprises the metal support structure (e.g., skeleton) of substantially the entire layer of the interface material 130. Thus, in certain embodiments, the diffusion barrier 160 can be throughout the interface material.

In the example shown in FIG. 7B, the thermoelectric device 100 further comprises at least one diffusion barrier 160 between the at least one interface material 130 and the at least one thermoelectric element 120. In order to reduce or help prevent diffusion of materials of the interface material 130 and materials of the shunt 110, certain embodiments of thermoelectric devices 100 further comprise at least one diffusion barrier 160 between the at least one interface material 130 and the at least one thermoelectric element 120. Although the diffusion barrier 160 is shown in FIG. 7B between the thermoelectric element 120 and the interface material 130, a diffusion barrier 160 can also be between the shunt 110 and the interface material 130.

The diffusion barrier 160 can comprise Ni, Mo, W, Fe, Co, Zr, Hf, or V. For example, the materials for the diffusion barrier can comprise: Ni, Mo, and other materials for $Bi_2Te_3$- and $Sb_2Te_3$-based alloys; W, Fe, and SnTe for PbTe-based alloys; Fe, Co, Ni, Zr, Hf, V, W, and other pure metals and alloys for $FeSb_3$- and $CoSb_3$-based alloys (skutterudites). The diffusion barrier can also comprise intermetallic compounds such as NiAl, pnictogenides such as $ZrSb_2$, or chalcogenides such as SnTe. The method of applying a diffusion barrier 160 and the thickness of the diffusion barrier 160 can be modified based on the selected materials and intended application of use. Examples of the variety of elements (e.g., metals) that can be used as diffusion barriers for skutterudite materials include those described in U.S. Patent Application Publication No. 2006/0118159 A1 to Tsuneoka et al. in accordance with certain embodiments described herein.

Accordingly, diffusion barriers 160 can be applied in several ways. As disclosed above, the diffusion barrier 160 can comprise a metal shell. For example, the core 350-shell 360 structure shown in FIG. 3, the coating used for the shell 360 can be selected in such a way that the material for the shell 360 can act as a diffusion barrier 160.

Additionally or alternatively, the diffusion barrier 160 can comprise a metal coating over the shell material of a core 350-shell 360 structure. For example, the core 350-shell 360 structure shown in FIG. 3 can have an additional coating on the shell 360 made from another material acting as a diffusion barrier 160. In some such embodiments, when powders are sintered to form the interface material 130, the material for the diffusion barrier 160 can be in direct contact with the thermoelectric element 120 and the inner layer of metal can provide structural strength and electrical and thermal conductance. For example, the basic core 350-shell 360 structure may be a powder of Ni-coated graphite, over-coated with a thin layer of hafnium, zirconium, titanium, iron, cobalt, or vanadium.

In certain other embodiments, the diffusion barrier 160 can comprise a diffusion barrier material dispersed within the at least one interface material 130. For example, rather than coating the interface material 130 with a material for the diffusion barrier 160, the material for the diffusion barrier 160 in powder form may be mixed with the powder for the interface material 130 before sintering. For example, hafnium, zirconium, titanium, iron, cobalt, or vanadium powder may be mixed with the nickel-coated graphite powder prior to placing the NiG in the form 400 with the materials for the thermoelectric element 120 and the shunt 110. The quantity of metal used can be sufficient to form a layer between a skutterudite thermoelectric element 120 and the nickel-coated graphite material to prevent diffusion of nickel into the skutterudite and antimony into the nickel.

Furthermore, in certain embodiments, at least a layer, e.g., a thin layer, of diffusion barrier material 160 can be placed or formed between the interface material 130 and the thermoelectric element 120. This layer can be made by many methods known in the art or yet to be developed, including placing a foil or powder in position prior to sintering. Alternatively, either a solid part of the interface material 130 or a solid part of the thermoelectric element 120 can be electroplated or otherwise coated with a diffusion barrier 160 prior to bonding or sintering.

Section 4. Stacks for TE Engines

Figure 8B:
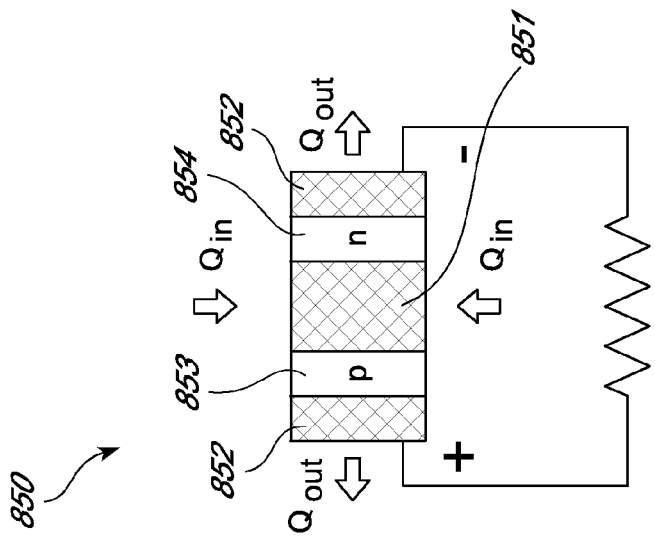
FIG. 8B schematically illustrates an example thermoelectric power generator comprising a single p-n pair in a stacked configuration.
Figure 8A:
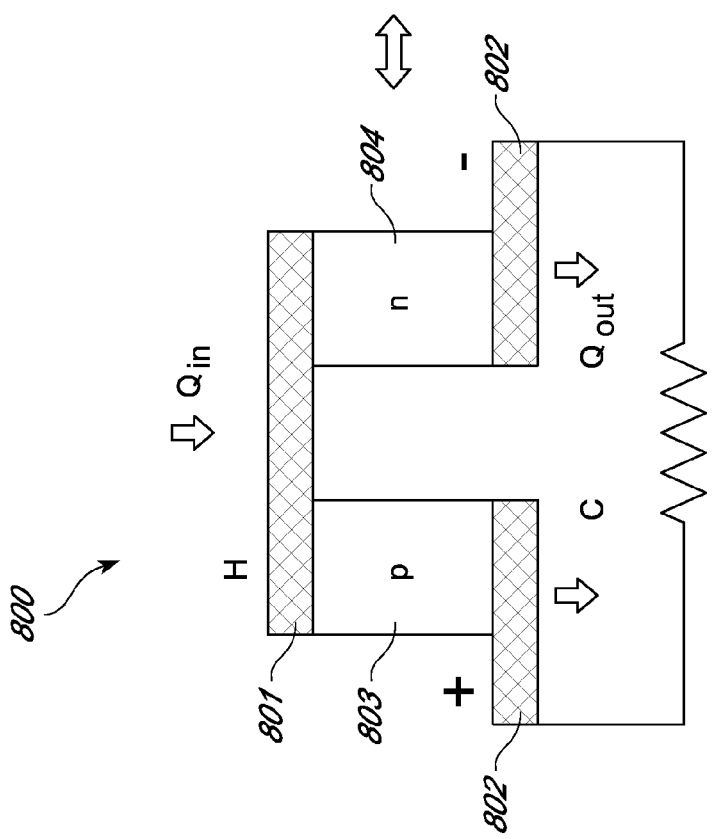
FIG. 8A schematically illustrates an example thermoelectric power generator comprising a single p-n pair in a traditional "Stonehenge" configuration.

A TE engine can be defined as a functional unit of a thermoelectric device for power generation (e.g., a thermoelectric generator or TEG). FIGS. 8A and 8B schematically illustrate two example configurations of a thermoelectric device for power generation comprising a single p-n pair. An actual TEG can comprise multiple pairs.

As shown in FIG. 8A, the engine 800 can have a hot shunt 801 connected to a high-temperature heat source (for example, a gas heat exchanger not shown), at least one cold shunt 802 connected to a low-temperature heat sink (for example, a liquid heat exchanger not shown), and at least one p-type thermoelectric element 803 and at least one n-type thermoelectric element 804 between the hot and cold shunts 801, 802. The engine can be capable of generating power if heat flows from the hot side H to the cold side C. In this case, a voltage potential can be established between p-n pairs 803, 804 and if an electrical connection is made on the cold shunt 802 or on the hot shunt 801, this potential can be used to drive galvanic devices or to charge galvanic cells. The engine 850 in FIG. 8B similarly has a hot shunt 851 connected to a high-temperature heat source (for example, a gas heat exchanger not shown), at least one cold shunt 852 connected to a low-temperature heat sink (for example, a liquid heat exchanger not shown), and at least one p-type thermoelectric element 853 and at least one n-type thermoelectric element 854 between the hot and cold shunts 851, 852. The engine can be capable of generating power if heat flows in as $Q_{in}$ and out as $Q_{out}$. In this case, a voltage potential can be established between p-n pairs 853, 854 and if an electrical connection is made on the cold shunt 852 or on the hot shunt 851, this potential can be used to drive galvanic devices or to charge galvanic cells.

Stacks of thermoelectric elements 120, such as those shown in FIG. 5E, can be produced with a center hole using appropriately shaped forms or dies. These parts then can be stacked to form a "cartridge," as described in U.S. patent application Ser. No. 13/489,237, filed Jun. 5, 2012, which is based on U.S. Provisional Appl. Nos. 61/493,926 and 61/566, 194, each of which is incorporated in its entirety by reference herein. Stacks can be formed in many configurations for later assembly into TE engines. FIGS. 9A-9D show examples of stack cross-sections. As shown in FIGS. 9A-9D, a stack having a direction of current flow can have a cross-section generally perpendicular to the direction of current flow that is square, circular, annular, part of a ring, or other cross-sectional shape.

Preparing stacked materials with interface materials between hot and cold shunts 110 and thermoelectric elements 120 can enable sintering of longer parts with multiple p-n pairs. For example, stacks with interface materials may be used in thermoelectric assemblies and systems as described in U.S. patent application Ser. No. 13/489,192, filed Jun. 5, 2012, and U.S. patent application Ser. No. 13/488,989, filed on Jun. 5, 2012, each of which is incorporated in its entirety by reference herein.

FIGS. 10A-10D show examples of stackable "unit cells." As shown in FIGS. 10A-10D, the stacks 1000 can comprise at least one shunt 1101, at least one interface material 1102, and at least one thermoelectric element 1103. As an example, the at least one shunt 1101 can comprise copper, the at least one interface material 1102 can comprise nickel-coated graphite, and the at least one thermoelectric element 1103 can comprise a skutterudite. Other materials, such as those disclosed herein, and combinations of materials can also be used, e.g., selected based on the intended application of use. The shape and dimensions can also be based on the selected materials and intended application of use.

Figure 10A:
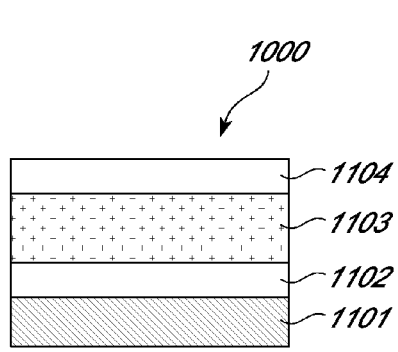
FIGS. 10A-10D show examples of stackable "unit cells" in accordance with certain embodiments described herein.

As shown in FIG. 10A, the stack 1000 can comprise a second interface material 1104. In some embodiments, the at least one interface material 1102 and the second interface material 1104 comprise the same material. For example, the same material can comprise nickel-coated graphite. Materials other than nickel-coated graphite, such as those disclosed herein, can also be used, selected based on the intended application of use. Also, the at least one interface material 1102 and the second interface material 1104 can comprise different materials from one another.

Figure 10B:
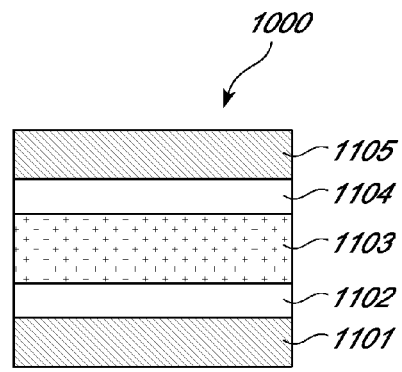

In further embodiments, as shown in FIG. 10B, the stack 1000 further can comprise a second shunt 1105. The second interface material 1104 can be between the at least one thermoelectric element 1103 and the second shunt 1105. In some embodiments, the at least one shunt 1101 and the second shunt 1105 comprise the same material. For example, the same material can comprise copper. Materials other than copper, such as those disclosed herein, can also be used, e.g., selected based on the intended application of use. Also, the at least one shunt 1101 and the second shunt 1105 can comprise different materials from one another.

Figure 10C:
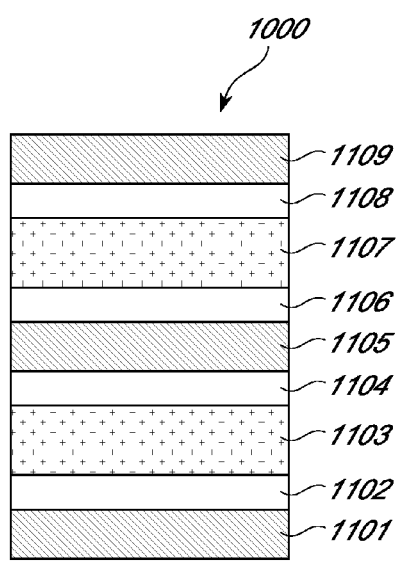

As shown in FIG. 10C, the stack 1000 further can comprise a third interface material 1106 and a second thermoelectric element 1107. The third interface material 1106 can be between the second shunt 1105 and the second thermoelectric element 1107. The at least one thermoelectric element 1103 can comprise a p-type thermoelectric element and the second thermoelectric element 1107 can comprise an n-type thermoelectric element. The at least one thermoelectric element 1103 and the second thermoelectric element 1107 can comprise skutterudite or any other material, such as those disclosed herein, e.g., selected based on the intended application of use. Also, the at least one thermoelectric element 1103 and the second thermoelectric element 1107 can comprise different materials from one another.

Furthermore, the stack 1000 can comprise a fourth interface material 1108 and a third shunt 1109. The fourth interface material 1108 can be between the second thermoelectric element 1107 and the third shunt 1109. The fourth interface material 1108 can comprise the same or different materials from the other interface materials 1102, 1104, 1106, and the third shunt 1109 can comprise the same or different materials from the other shunts 1101, 1105.

Figure 10D:
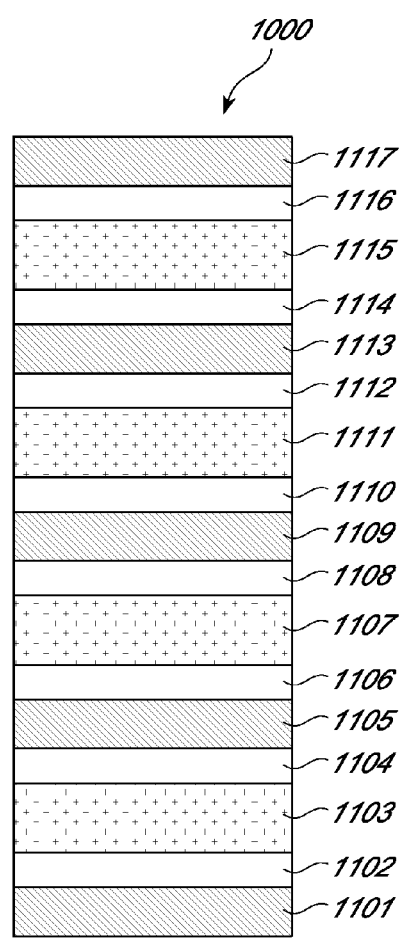

As shown in FIG. 10D, additional interface materials 1110, 1112, 1114, 1116, additional thermoelectric elements 1111, 1115, and additional shunts 1113, 1117 can be used. In some embodiments, all the interface materials can comprise the same material, e.g., nickel-coated graphite, while in other embodiments, two or more of the interface materials can comprise different materials from one another. Additionally, all thermoelectric elements can comprise the same material, e.g., skutterudite, while in other embodiments, two or more of the thermoelectric elements can comprise different materials from one another. Furthermore, all shunts can comprise the same material, e.g., copper, while in other embodiments, two or more of the shunts can comprise different materials from one another. Other materials, such as those disclosed herein, and combinations of materials can also be used, e.g., selected based on the intended application of use. The shape and dimensions can also be based on the selected materials and intended application of use. For example, the shape and dimensions of all the shunts can be the same as one another, or two or more of the shunts can have shapes and/or dimensions that are different from one another. The shape and dimensions of all the thermoelectric elements can be the same as one another, or two or more of the thermoelectric elements can have shapes and/or dimensions that are different from one another. The shape and dimensions of all the interface materials can be the same as one another, or two or more of the interface materials can have shapes and/or dimensions that are different from one another.

Figure 11A:
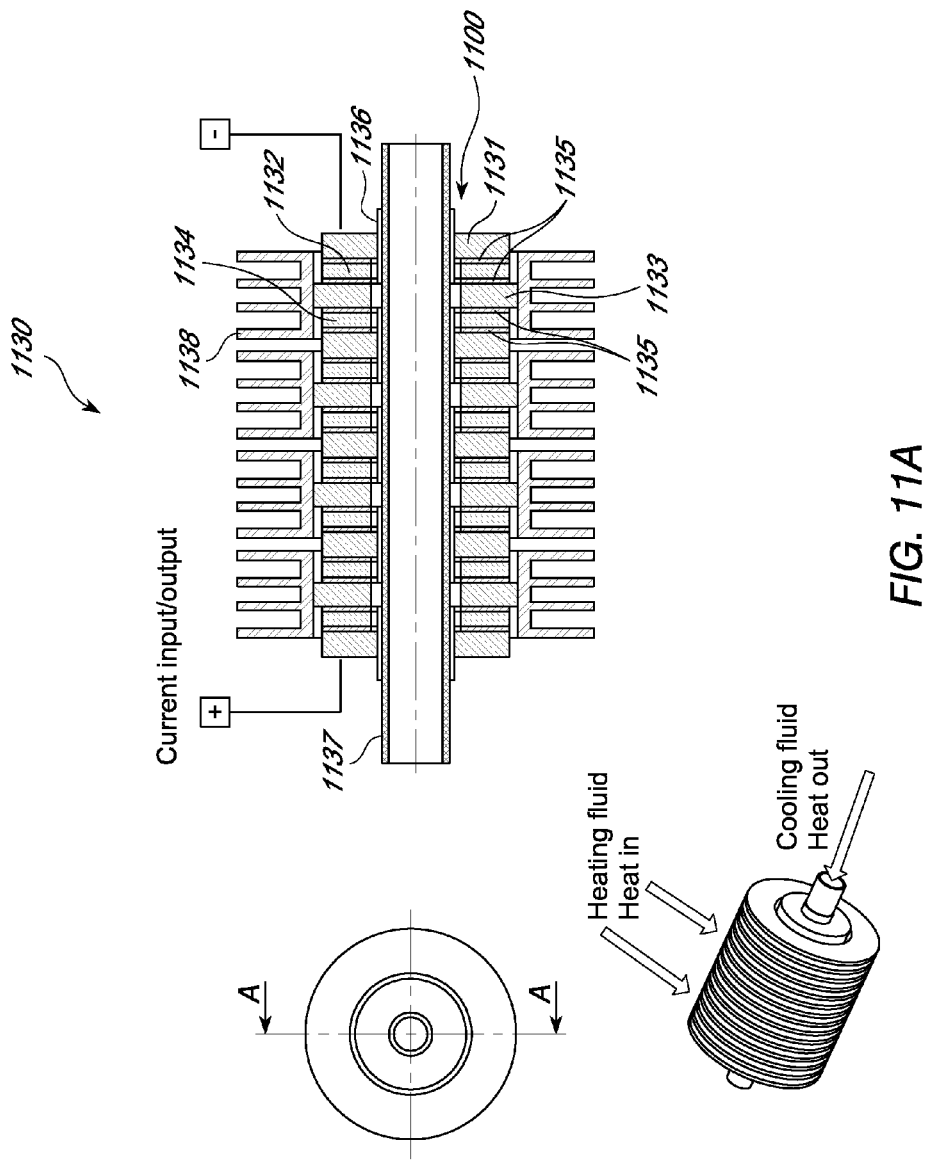
FIG. 11A schematically illustrates an example cartridge made with fins on the outside surface.

As shown in FIG. 11A, stacks can be attached to interior tubes (e.g., a heat sink or heat source) and to exterior finned surfaces (e.g., a heat source or heat sink). The example cartridge 1130 comprises a stack 1100 comprising a cold shunt 1131, a p-type thermoelectric element 1132, a hot shunt 1133, an n-type thermoelectric element 1134, and interface materials 1135. The example cartridge 1130 also comprises a cold ring 1136, a tube 1137, and a finned ring 1138. The cold shunt 1131 can be a co-pressed metal cold shunt, and the hot shunt 1133 can be a co-pressed metal hot shunt. The p-type and n-type thermoelectric elements 1132, 1134 can be thermoelectric material pressed simultaneously with the shunts 1131, 1133 and interface materials 1135. The interface materials 1135 can be composite materials co-pressed in the areas between the shunts 1131, 1133 and thermoelectric elements 1132, 1134. The cold ring 1136 can provide an interface between the stack 1100 and the tube 1137, which can be a cooling tube filled with liquid. The finned ring 1138 can provide a finned surface in contact with the hot shunt 1133. The surface of the finned ring 1138 can also be in contact with hot gas or liquid.

By attaching the stack 1100 to an interior tube 1137 and to an exterior finned ring 1138, the example configuration 850 schematically depicted in FIG. 8B can be fabricated where incoming and outgoing heat fluxes are alternating on the shunts 851, 852. The electric potential difference can be picked up from the first and last shunts 852 in the stack 850.

Figure 11B:
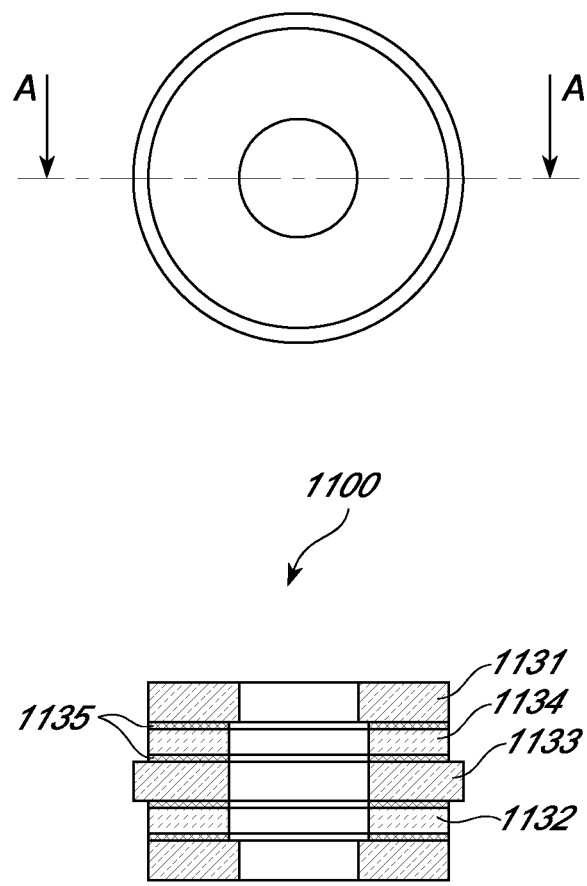
FIG. 11B schematically illustrates an example cartridge with alternating shunts having different diameters.

In some embodiments, alternating shunts can have different geometries. For example, as shown in FIGS. 11A and 11B, a ring-shaped stack 1100 can be made such that the hot shunts 1133 have larger outer and inner diameters than the cold shunts 1131. The sizes and dimensions of the inner and outer diameters can be based on the intended application of use. Certain embodiments of the design shown in FIGS. 11A and 11B can allow only the cold shunts 1131 to contact the interior tube 1137/cold ring 1136 and only the hot shunts 1133 to contact the surfaces of the exterior finned ring 1138. Such a stack 1100 can be manufactured by hot pressing or SPS using solid shunts or powders and multi-level dies or forms known in the art or yet to be developed. For example, for the interior portion, stepped core rods or soluble core rods may be used.

Thus, in certain embodiments, each of a first shunt, e.g., 1131, and a second shunt, e.g., 1133, can have a direction of current flow and a cross-section generally perpendicular to the direction of current flow. The cross-section of the first shunt, e.g., 1131, and the cross-section of the second shunt, e.g., 1133, can have different geometries. For example, the first and second shunts can have annular (ring-shaped) cross-sections. The second shunt can have a larger outer diameter, a larger inner diameter, or both a larger outer diameter and a larger inner diameter than the first shunt. Other cross-sectional shapes, e.g., oval, square, rectangular, triangular, pentagonal, hexagonal, octagonal, etc., can be contemplated. In some embodiments, the first and second shunts can have the same cross-sectional shape, but with different cross-sectional sizes, e.g., areas, perimeters, lengths, widths, diagonals, or other characteristic dimensions. In other embodiments, the first and second shunts can have different cross-sectional shapes from each other.

The above description discloses one of the possible configurations in which stacks can be used. Alternative methods of using stacks include the standard "Stonehenge" configuration, as shown in FIG. 8A in which single p- and n-stacks 803, 804 are alternately connected to the hot shunt 801 and to the cold shunts 802 to form a p-n chain.

Stacks can be sintered with the axial center tube 1137 already in the core, as shown in FIG. 11A. In such embodiments, the tube 1137 can act as a part of the die or form during sintering. By sintering the stacks 1000 with the tubes 1137, the number of post processing operations can be advantageously reduced.

The example cartridge assembly 1130 in FIG. 11A shows the heat source on the outside of the device (e.g., in contact with the fins) and the heat sink (cooling fluid) on the inside of the device (e.g., within the tube). Alternatively, the inside of the device may be the source of heat and the outside of the device may be the heat sink. This generalization of the heat flow direction can apply to all devices described in this disclosure.

Figure 11C:
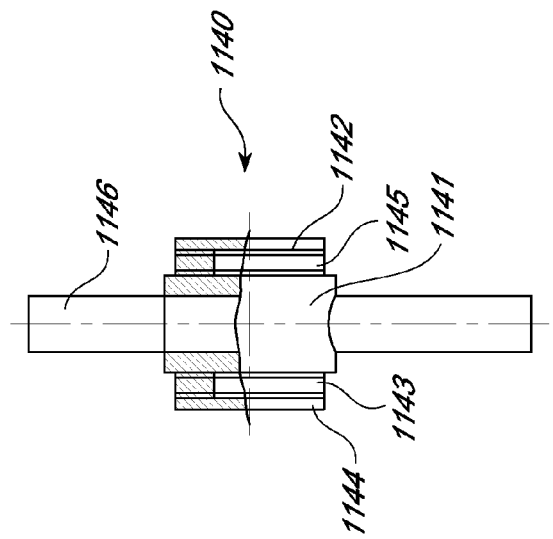
FIG. 11C schematically illustrates an example stack sintered with a tube in the cross flow direction.
Figure 11C:
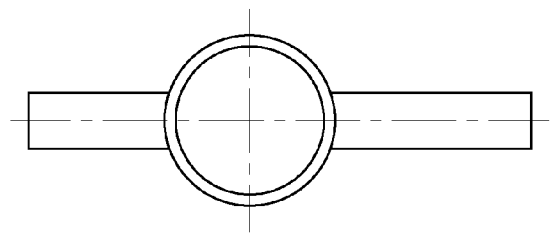
Figure 11C:
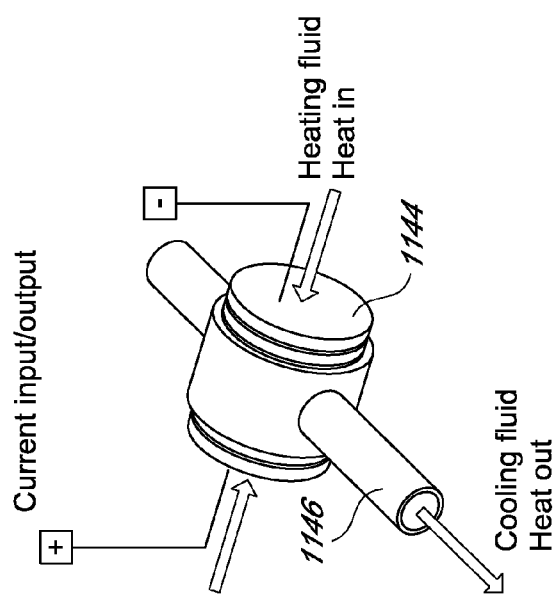

Alternatively, stacks can be sintered with the tube in a cross flow direction as shown in FIG. 11C. The thermoelectric device 1140 can include a cold shunt 1141, interface material 1142, an n-type thermoelectric element 1143, a hot shunt 1144, a p-type thermoelectric element 1145, and a cooling tube 1146. The cold shunt 1141 can be sintered around the cooling tube 1146. The hot shunt 1144 can be sintered with the stack. The interface material 1142 can comprise composite materials sintered in the area between shunts 1141, 1144 and thermoelectric elements 1143, 1145. The cooling tube 1146 can carry cooling or coolant fluid. In such embodiments, coolant fluid can flow through the tube 1146 and the heat source can be flat heat exchangers (not shown) on the flat sides of hot shunts 1144. Two or more engines can be connected thermally via the cold tubes 1146 and heat exchangers to form a larger thermoelectric device.

Section 5. Sublimation Reduction and Hermeticity in Stacks

Figure 12A:
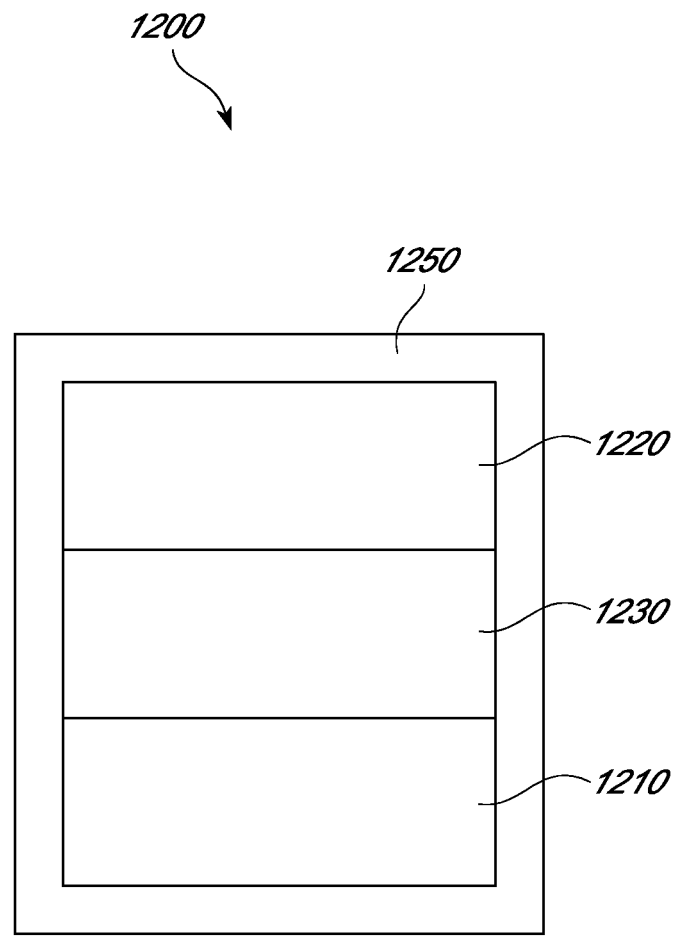
FIG. 12A schematically illustrates an example thermoelectric device with a coating over the shunt, thermoelectric element, and interface material.

In order to achieve oxygen protection and reduction of sublimation of thermoelectric materials under operating conditions, stacks can be protected by applying external coatings. For example, in certain embodiments as shown in FIG. 12A, the thermoelectric device 1200 can further comprise at least one coating 1250 over the at least one shunt 1210, the at least one thermoelectric element 1220, and the at least one interface material 1230. At least one coating as described herein can refer to a single layer or multiple layers of a coating. Coatings 1250 can be applied to the external surfaces of a stacked cartridge in order to hermetically seal the shunts 1210, thermoelectric elements 1220, and interface materials 1230. Additionally or alternatively, in certain embodiments of thermoelectric devices 1200, the at least one coating 1250 over the at least one shunt 1210, the at least one thermoelectric element 1220, and the at least one interface material 1230 can be configured to reduce sublimation of the materials of the thermoelectric element 1220. For example, a coating 1250 applied to all external surfaces may reduce or principally prevent sublimation of the materials of the thermoelectric elements 1220. In other embodiments, the coating 1250 may cover only at least the thermoelectric element 1220 to reduce or prevent sublimation of the materials of the thermoelectric element 1220. In yet further embodiments, the coating 1250 may cover principally the portions of the stack expected to see high temperatures, e.g., temperatures at which the partial pressure of the subliming atomic element is high.

Figure 12B:
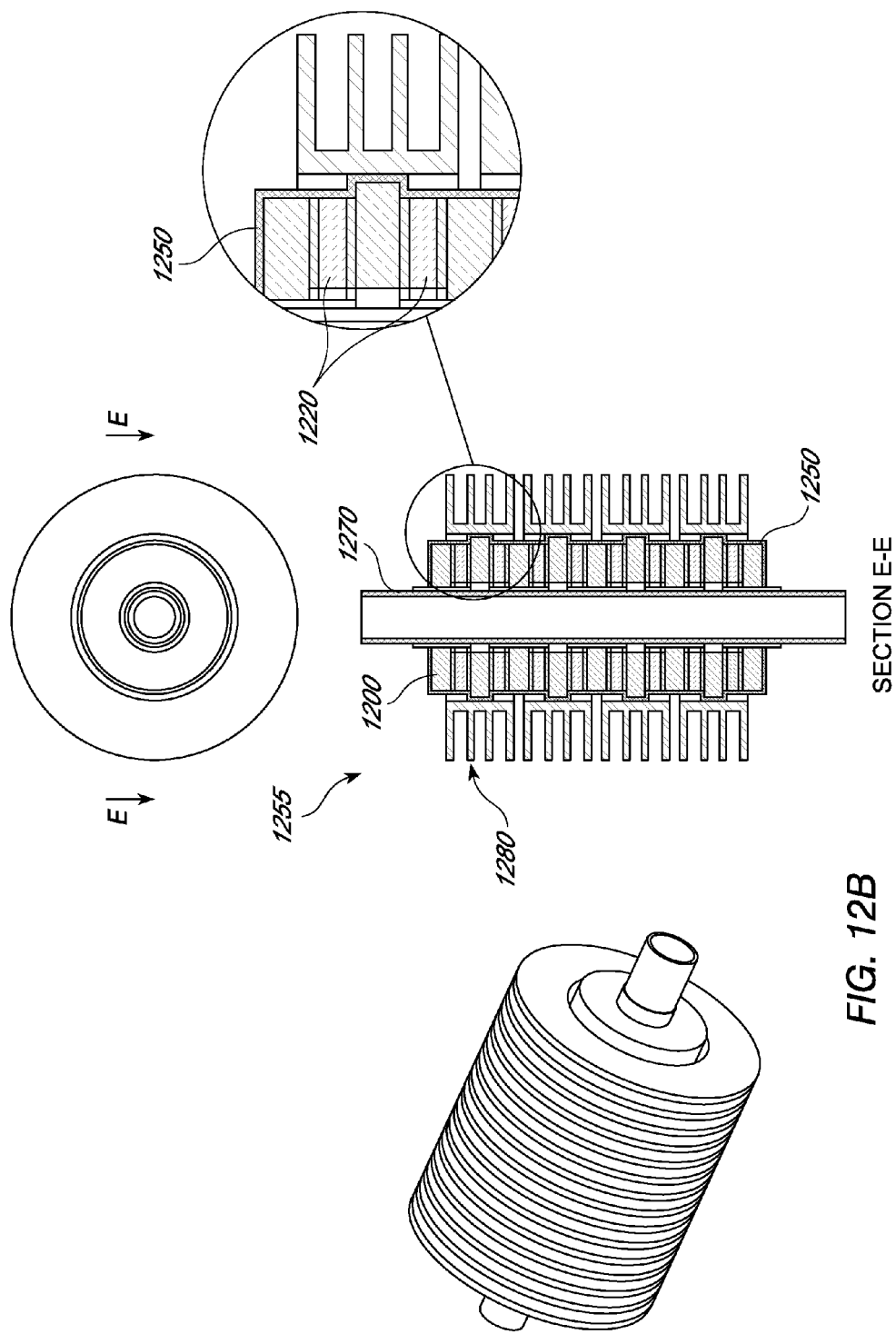
FIG. 12B schematically illustrates an example hermetic sealing of an example cartridge prepared from thermoelectric stacks by an example method of applying an external coating to thermoelectric elements and shunts.

FIG. 12B shows an example of certain embodiments of a thermoelectric device 1255, e.g., a cartridge, including a set of stacks 1200 on a tube 1270. The set of stacks 1200 can comprise p-type and n-type thermoelectric elements, cold and hot shunts, and interface materials as described herein. The set of stacks 1200 is coated with coating 1250 on the outside surface in order to provide for sealing or protection. Finned rings 1280 are attached to the external, already coated surface. In some embodiments, the coating 1250 also acts as a thermal conductor and an electrical insulator, carrying heat from the finned rings 1280 to the hot shunts but not connecting the hot shunts electrically. In some embodiments, the thermal conductance of the at least one coating 1250 is less than about 15% of the thermal conductance of the at least one thermoelectric element 1220, and the electrical conductance of the at least one coating 1250 is less than about 15% of the electrical conductance of the thermoelectric element 1220.

The coating 1250 can comprise oxides, ceramics, glass, enamel, and similar dielectric materials and can be applied by methods of plasma spraying, physical or chemical vapor deposition, dipping, or other methods known in the art or yet to be developed. In some cases, the deposition may be followed by firing at temperatures between about 600° C. and about 900° C., such as in the case of enamel. In some instances, high temperature paints can be used as external coatings 1250. In some instances, where the outside temperature is low during use, organic materials and epoxies can be used as external coatings 1250.

Coatings 1250 can also be applied during the pressing process by spraying powders into cavities of the pressing tool. In some such embodiments, the coating 1250 can go through the sintering process together with the base materials. The thickness of the coating 1250 can be based on the selected materials and intended application of use.

After the coating 1250 is applied to the stack or stacks 1200, finned rings 1280 can be attached to the stack 1200 outside of the coating 1250 as shown in FIG. 12B. In some embodiments, the finned rings 1280 may be brazed or soldered to the coatings 1250, either by metallizing the coating 1250, by use of reactive braze or solder alloys, or by other methods. Surfaces of the finned rings 1280 can also be press-fit to the outer diameter of a stack 1200. In some instances, such as with enamels, finned rings 1280 can be placed over uncured coatings 1250 and then the entire device fired at the temperatures between about 700° C. and about 900° C. to form a protective seal over the thermoelectric element 1220 and a bond between the outer diameter of the stacks 1200 and the inner diameter of the finned rings 1280. In some instances, as for example when paints and epoxies are used on the outer diameter of a stack 1200, finned rings 1280 can be fitted after the coating 1250 is applied and cured at room temperature or at temperatures less than about 300° C. in order to form a protective seal over the thermoelectric element 1220 and a bond between the stack 1200 and the finned surface 1280.

In other embodiments, finned rings 1280 can be placed directly against the hot shunts 1215 of stacks 1200, as shown in FIGS. 12C and 12D. In some of these embodiments, the hot shunts 1215 and finned surfaces 1280 are electrically connected, e.g., bonded. In order to hermetically seal such a cartridge and electrically isolate the shunts 1215 at the same time, external fillers 1251, e.g., dielectric materials, can be applied between the finned rings 1280, as shown in FIG. 12E. These external fillers 1251 can comprise oxides, ceramics, glass, and enamel among others, and can be applied by methods of plasma spraying, physical or chemical vapor deposition or dipping, if necessary followed by firing at the temperatures between about 600° C. and about 900° C., as in the case of enamel. In some instances, high temperature paints can be used as external fillers 1251. In some instances where outside temperatures are low, organic materials and epoxies can be used as external fillers 1251. To complete the seal, a hermetic end cap 1252 can be provided for the cartridge, as shown in FIG. 12E.

Figure 13:
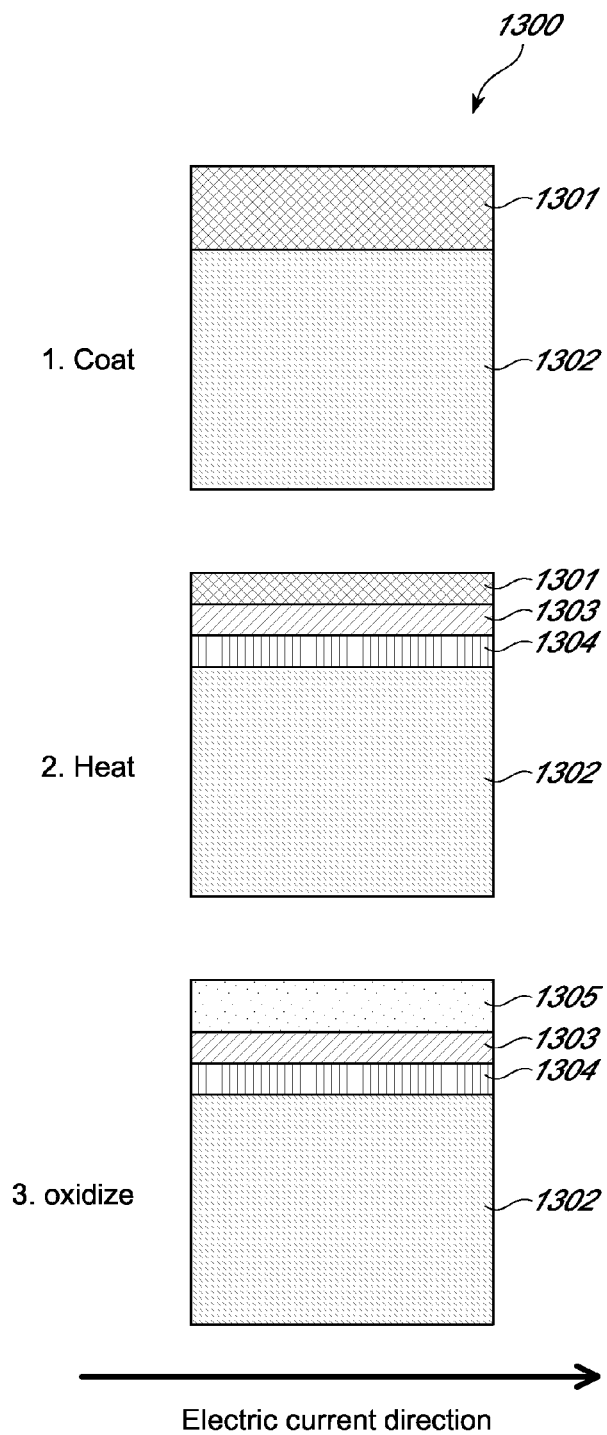
FIG. 13 schematically illustrates an example process of forming a protective oxide coating on a surface of a thermoelectric device in accordance with certain embodiments described herein.

In other embodiments, reduction of sublimation of antimony from skutterudite thermoelectric elements in stacks includes coating the stacks with one or more reactive materials that would react with the Sb from $CoSb_3$, creating a product layer. Examples of such materials are Cr, Mn, Zr, Al, Hf, etc. After coating and heating, the surface of the stack can be exposed to oxygen to form an oxide or nitride coating on the surface, reducing the electrical conductivity of the surface coating. FIG. 13 is a schematic of an example process 1300 of forming a protective oxide coating 1305 on a surface of a thermoelectric device in accordance with certain embodiments described herein. In this figure, an original metal layer 1301 is coated over a thermoelectric material 1302. Upon heating, a compound 1303 of the metal layer 1301 and an element from the thermoelectric material 1302, such as Sb in the case of $CoSb_3$, forms between the metal layer 1301 and thermoelectric material 1302. A zone 1304 results in the thermoelectric material 1302 that is depleted in the element that has reacted to form the compound 1303. In the case of $CoSb_3$, this zone 1304 may comprise $CoSb_2$. An oxide layer or coating 1305 can be formed by oxidizing the remaining original metal layer 1301 on the surface to create a protective, electrically insulating surface layer on the thermoelectric material 1302.

Section 6. Tapered TE Elements

Figure 14B:
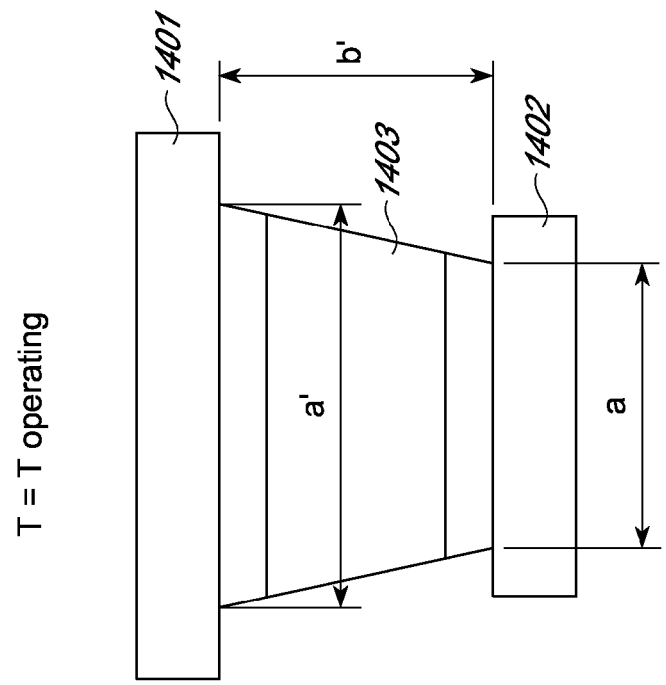
FIGS. 14A and 14B schematically illustrate an example model used to approximate interface stress.
Figure 14A:
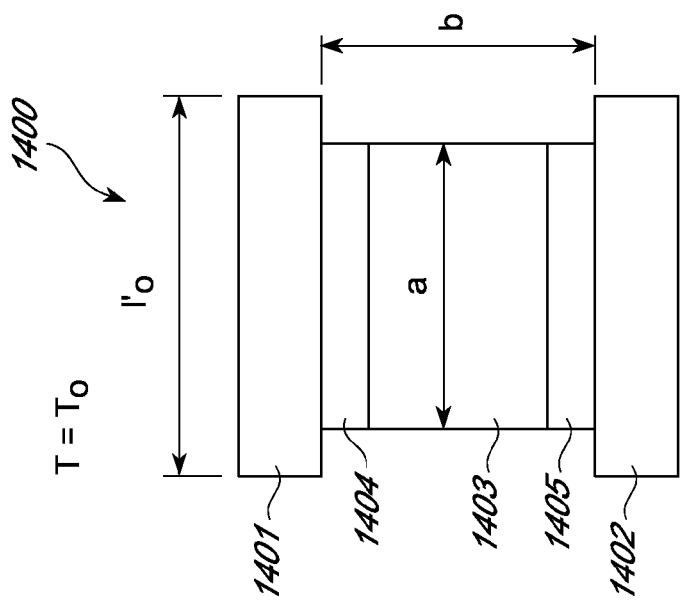

In certain embodiments, thermoelectric devices with reduced interface shear stress and methods of manufacturing the same are provided. FIGS. 14A and 14B schematically illustrate an example model used to approximate interface stress T. The thermoelectric device 1400 can comprise a hot shunt 1401, a cold shunt 1402, a thermoelectric element 1403, and metallization 1404, 1405 between the thermoelectric element 1403 and the hot and cold shunts 1401, 1402 respectively. As shown in FIG. 14A, a and b are characteristic dimensions, e.g., an outer diameter and height, of the thermoelectric element 1403 at a temperature $T_o$, and $l'_o$ is a characteristic dimension, e.g., an outer diameter, of the shunts 1401, 1402. As shown in FIG. 14B, a' and b' are characteristic dimensions, e.g., a maximum outer diameter and a height, of the thermoelectric element 1403 at an operating temperature. The a' and b' dimensions can be given as a'=a·$CTE_2$ ($T_{hot}$) and b'=b·$CTE_1$ ($T_{cold}+T_{hot}$)·0.5. Thus, the interface stress t can be approximated as:

$$\tau = \frac{0.5[a - (CTE_2 \times a \times T_{hot})] \times G_3}{b \times CTE_1(T_{cold} + T_{hot}) \times 0.5}$$

where $CTE_1$ is the coefficient of thermal expansion of the material of the thermoelectric element 1403, $CTE_2$ is the coefficient of thermal expansion of the material of the shunts 1401, 1402, and $G_3$ is the shear modulus of the metallization 1404, 1405.

Figure 15:
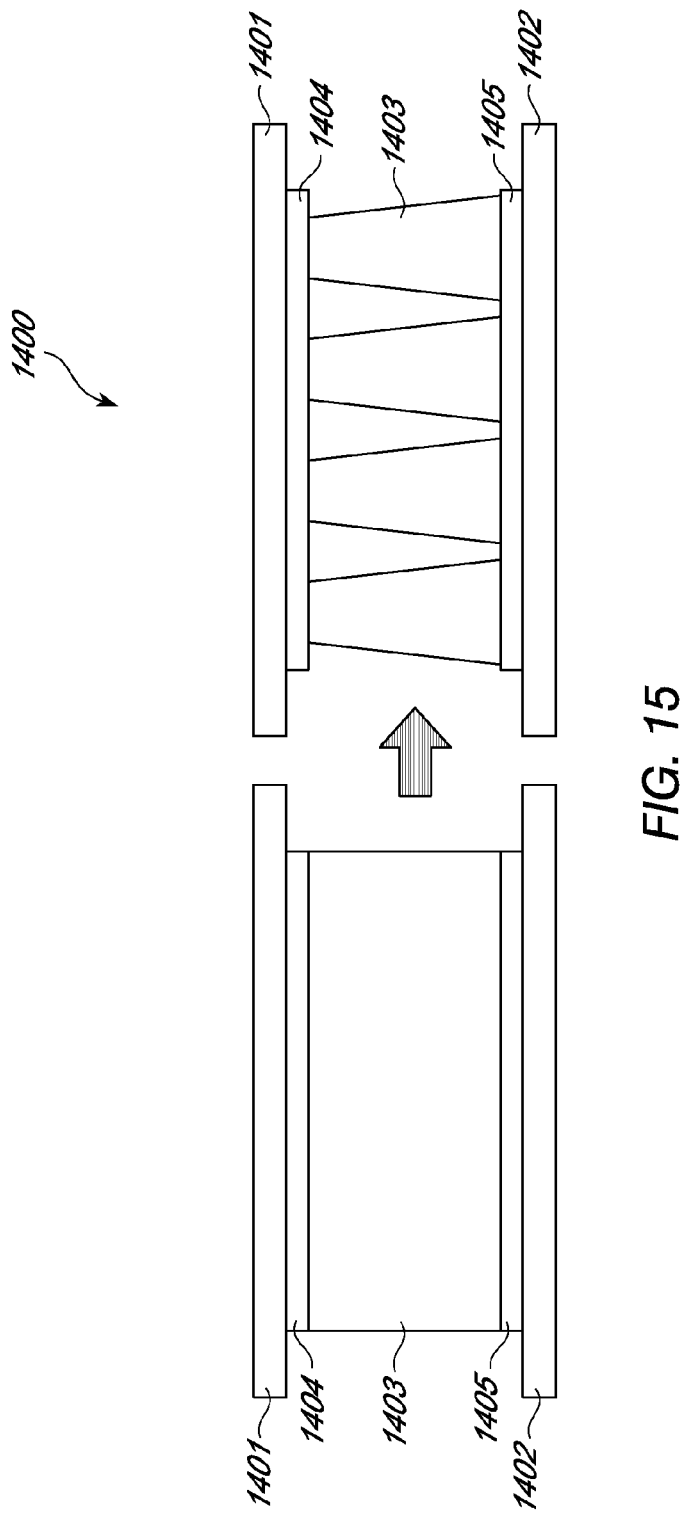
FIG. 15 schematically illustrates an example of tapered thermoelectric elements in accordance with certain embodiments described herein.

The size of the thermoelectric elements 1403 can be selected in such way that the aspect ratio of the surface area and material's height can provide optimum performance of the thermoelectric device 1400. In some instances, this can mean a large ratio of a/b. As illustrated in FIGS. 14A and 14B, interface shear stress τ can be proportional to a/b. Thus, one method of reducing this stress can be by pressing the thermoelectric elements 1403 into the example configuration illustrated in FIG. 15. In certain embodiments, this method can achieve very small ratios a/b without changing the optimum ratio of surface area to height of the thermoelectric element 1403. In certain embodiments, tapered thermoelectric elements can also be used in thermoelectric devices with interface materials, and/or diffusion barriers, and/or hermetic coatings, and/or coatings to reduce sublimation, and/or methods of manufacturing the same, such as those described herein.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. A thermoelectric device comprising:
at least one shunt;
at least one thermoelectric element of a first material in thermal and electrical communication with the at least one shunt; and
at least one interface material different from the first material between the at least one shunt and the at least one thermoelectric element, wherein the at least one interface material comprises a plurality of cores of a second material separated from one another and surrounded on all sides by a shell of a third material different from the second material, wherein the at least one interface material is at least 95% dense and configured to undergo deformation under at least one of the group consisting of: (i) a normal load between the at least one shunt and the at least one thermoelectric element, the normal load being in a direction generally perpendicular to a plane that is generally parallel to the at least one shunt and the at least one thermoelectric element, and (ii) a shear load between the at least one shunt and the at least one thermoelectric element, the shear load being in a direction generally parallel to the plane that is generally parallel to the at least one shunt and the at least one thermoelectric element, wherein the deformation reduces interface stress between the at least one shunt and the at least one thermoelectric element,
wherein the second material comprises at least one thermally and electrically conductive material or at least one dielectric material, the at least one thermally and electrically conductive material comprising at least one of the group consisting of: carbon, graphite, silicon carbide, Si, W, TiC, and WC, the at least one dielectric material comprising at least one of the group consisting of: aluminum oxide, aluminum nitride, glass frits, and glass bubbles.

2. The thermoelectric device of claim 1, wherein the at least one interface material is rigidly bonded to the at least one shunt and the at least one thermoelectric element.

3. The thermoelectric device of claim 1, wherein the at least one thermoelectric element and the at least one shunt have different coefficients of thermal expansion.

4. The thermoelectric device of claim 1, wherein the interface material comprises at least one of the group consisting of: Ni, Co, Mo, Fe, and Cu.

5. The thermoelectric device of claim 1, wherein the interface material comprises at least the second material surrounded by at least one metal.

6. The thermoelectric device of claim 5, wherein the at least one metal comprises at least one of the group consisting of: Ni, Mo, W, Ti, Co, Fe, Hf, Zr, and Bi.

7. The thermoelectric device of claim 1, wherein the interface material comprises nickel-coated graphite with a mass fraction of nickel from about 60 percent to about 95 percent.

8. The thermoelectric device of claim 7, wherein the graphite of the nickel-coated graphite substantially fills gaps between metal layers of the nickel.

9. The thermoelectric device of claim 1, wherein the at least one shunt comprises copper, the at least one thermoelectric element comprises a skutterudite, and the at least one interface material comprises nickel-coated graphite.

10. The thermoelectric device of claim 1, wherein the at least one interface material comprises a diffusion barrier between the at least one shunt and the at least one thermoelectric element.

11. The thermoelectric device of claim 10, wherein the diffusion barrier comprises a metal shell.

12. The thermoelectric device of claim 10, wherein the diffusion barrier comprises a metal coating over the shell.

13. The thermoelectric device of claim 10, wherein the diffusion barrier comprises a diffusion barrier material dispersed within the at least one interface material.

14. The thermoelectric device of claim 1, further comprising at least one diffusion barrier material between the at least one interface material and the at least one thermoelectric element.

15. The thermoelectric device of claim 14, wherein the at least one diffusion barrier material comprises at least one of the group consisting of: Ni, Mo, W, Fe, Co, Zr, Hf, and V.

16. The thermoelectric device of claim 1, further comprising at least one coating over the at least one shunt, the at least one thermoelectric element, and the at least one interface material.

17. The thermoelectric device of claim 16, wherein the at least one coating comprises at least one of the group consisting of: oxides, ceramics, glass, enamel, paint, organic material, and epoxy.

18. The thermoelectric device of claim 16, wherein the thermal conductance of the at least one coating is less than about 15% of the thermal conductance of the at least one thermoelectric element, and the electrical conductance of the at least one coating is less than about 15% of the electrical conductance of the thermoelectric element.

19. The thermoelectric device of claim 16, wherein the at least one coating is configured to hermetically seal the at least one shunt, the at least one thermoelectric element, and the at least one interface material.

20. The thermoelectric device of claim 16, wherein the at least one coating is configured to reduce sublimation of a material of the at least one thermoelectric element.

21. The thermoelectric device of claim 1, wherein the thermoelectric device comprises a stack of the at least one shunt, the at least one interface material, the at least one thermoelectric element, and a second interface material.

22. The thermoelectric device of claim 21, wherein the stack further comprises a second shunt, wherein the second interface material is between the at least one thermoelectric element and the second shunt.

23. The thermoelectric device of claim 22, wherein the stack further comprises:
a third interface material;
a second thermoelectric element, the third interface material between the second shunt and the second thermoelectric element;
a fourth interface material; and
a third shunt, the fourth interface material between the second thermoelectric element and the third shunt, wherein the at least one thermoelectric element comprises a p-type thermoelectric element and the second thermoelectric element comprises an n-type thermoelectric element.

24. The thermoelectric device of claim 23, wherein the at least one thermoelectric element and the second thermoelectric element comprise skutterudite.

25. The thermoelectric device of claim 22, wherein the at least one shunt and the second shunt comprise the same material.

26. The thermoelectric device of claim 25, wherein the same material comprises copper.

27. The thermoelectric device of claim 21, wherein at least one interface material and the second interface material are the same material.

28. The thermoelectric device of claim 27, wherein the same material comprises nickel-coated graphite.

29. The thermoelectric device of claim 23, wherein the at least one shunt and the second shunt comprise copper, the at least one interface material and the second interface material comprise nickel-coated graphite, and the at least one thermoelectric element and the second thermoelectric element comprise skutterudite.

30. The thermoelectric device of claim 1, wherein the thermoelectric device comprises a stack of the at least one shunt, the at least one interface material, and the at least one thermoelectric element, the stack having a direction of current flow and having a cross-section generally perpendicular to the direction of current flow that is square, circular, annular, or part of a ring.

31. The thermoelectric device of claim 1, wherein each of the at least one shunt and a second shunt has a direction of current flow and has a cross-section generally perpendicular to the direction of current flow, and wherein the cross-section of the at least one shunt and the cross-section of the second shunt have different geometries.

32. A thermoelectric device comprising:
   at least one shunt; and
   at least one thermoelectric element of a first material in thermal and electrical communication with the at least one shunt;
   wherein the device comprises a structure of a second material different from the first material, the structure comprising a plurality of cores of a third material separated from one another and surrounded on all sides by a shell of a fourth material different from the third material, the structure being at least 95% dense and configured to undergo deformation under at least one of the group consisting of: (i) a normal load between the at least one shunt and the at least one thermoelectric element, the normal load being in a direction generally perpendicular to a plane that is generally parallel to an interface between the at least one shunt and the at least one thermoelectric element, and (ii) a shear load between the at least one shunt and the at least one thermoelectric element, the shear load being in a direction generally parallel to the plane that is generally parallel to the interface between the at least one shunt and the at least one thermoelectric element,
   wherein the second material comprises at least one thermally and electrically conductive material or at least one dielectric material, the at least one thermally and electrically conductive material comprising at least one of the group consisting of: carbon, graphite, silicon carbide, Si, W, TiC, and WC, the at least one dielectric material comprising at least one of the group consisting of: aluminum oxide, aluminum nitride, glass frits, and glass bubbles.

33. The thermoelectric device of claim 32, wherein the at least one shunt comprises the structure.

34. The thermoelectric device of claim 32, wherein current flows in a direction perpendicular to the interface.

35. The thermoelectric device of claim 1, wherein each of the at least one shunt, the at least one interface material, and the at least one thermoelectric element has a direction of current flow and has a cross-section generally perpendicular to the direction of current flow, and wherein at least two of the at least one shunt, the at least one interface material, or the at least one thermoelectric element have different cross-sections from each other.

* * * * *